(12) United States Patent
Kim

(10) Patent No.: US 10,825,502 B2
(45) Date of Patent: Nov. 3, 2020

(54) MEMORY SYSTEM FOR REMOVING MEMORY CELL FAULT AND METHOD THEREOF

(71) Applicant: SK hynix Inc., Gyeonggi-do (KR)

(72) Inventor: Woong-Rae Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 191 days.

(21) Appl. No.: 16/026,633

(22) Filed: Jul. 3, 2018

(65) Prior Publication Data

US 2019/0164595 A1 May 30, 2019

(30) Foreign Application Priority Data

Nov. 29, 2017 (KR) ........................ 10-2017-0161977

(51) Int. Cl.
| G11C 11/00 | (2006.01) |
| G11C 11/406 | (2006.01) |
| G11C 29/42 | (2006.01) |
| G06F 11/10 | (2006.01) |
| G11C 29/52 | (2006.01) |
| G11C 29/02 | (2006.01) |
| G11C 29/04 | (2006.01) |

(52) U.S. Cl.
CPC .... *G11C 11/40603* (2013.01); *G06F 11/1048* (2013.01); *G06F 11/1068* (2013.01); *G11C 11/40611* (2013.01); *G11C 11/40618* (2013.01); *G11C 11/40626* (2013.01); *G11C 29/023* (2013.01); *G11C 29/028* (2013.01); *G11C 29/42* (2013.01); *G11C 29/52* (2013.01); *G11C 2029/0411* (2013.01); *G11C 2211/4062* (2013.01)

(58) Field of Classification Search
CPC ......... G11C 11/40603; G11C 11/40611; G11C 11/40618; G06F 11/1048
See application file for complete search history.

(56) References Cited

U.S. PATENT DOCUMENTS

| 6,266,738 B1* | 7/2001 | Kobayashi | G11C 11/406 711/106 |
| 7,042,785 B2* | 5/2006 | Kim | G11C 11/406 365/201 |
| 7,474,578 B2* | 1/2009 | Lee | G11C 11/406 365/222 |
| 7,823,030 B2 | 10/2010 | Sutardja et al. | |
| 7,870,331 B2 | 1/2011 | Sutardja et al. | |
| 9,053,813 B2* | 6/2015 | Kang | G11C 11/40611 |
| 9,524,045 B2* | 12/2016 | Zachut | G06F 3/03545 |
| 9,812,185 B2* | 11/2017 | Fisch | G11C 11/406 |
| 9,870,834 B2* | 1/2018 | Li | G11C 29/44 |
| 9,875,025 B2* | 1/2018 | Syu | G11C 16/3431 |
| 10,048,877 B2* | 8/2018 | Miller | G06F 11/1666 |

FOREIGN PATENT DOCUMENTS

KR 101729874 4/2017

* cited by examiner

*Primary Examiner* — Esaw T Abraham
(74) *Attorney, Agent, or Firm* — IP & T Group LLP

(57) ABSTRACT

A memory system includes: a memory device that includes a plurality of ranks; and a memory controller suitable for deciding a plurality of refresh cycles for respective combinations of the plurality of ranks and at least one program executed onto the memory device based on a performance diagnosis result of each of the ranks when the program is executed, and controlling a refresh operation to be performed onto the ranks based on the decided refresh cycles.

21 Claims, 14 Drawing Sheets

Input layers (32)   Hidden layers (34)   Output layers (36)

MEMORY SYSTEM FOR REMOVING MEMORY CELL FAULT AND METHOD THEREOF

CROSS-REFERENCE TO RELATED APPLICATIONS

This application claims priority of Korean Patent Application No. 10-2017-0161977, filed on Nov. 29, 2017, which is incorporated herein by reference in its entirety.

BACKGROUND

1. Field

Exemplary embodiments of the disclosure of the present invention relate generally to a memory system and a method for operating the memory system.

2. Description of the Related Art

Generally, memories are fully tested in the fabrication stage before entering the market. However, in a practical usage environment, additional faults may occur, or be detected, in the memories. Additional faults may be categorized into two types: intermittent faults occurring intermittently according to an operational or environmental factor of a memory cell, and an aging fault that may not be recovered into a normal (no-fault) state because the fault originates from a physical deterioration of a memory cell.

SUMMARY

Embodiments of the present invention are directed to a memory system capable of curing faults that may occur in memory cells, and a method for operating the memory system.

Embodiments of the present invention are directed to a memory system that may predict, adjust, manipulate or control a customized refresh period to reduce or minimize intermittent faults that may occur in memory cells, and a method for operating the memory system.

In accordance with an embodiment of the present invention, a memory system includes: a memory device that includes a plurality of ranks; and a memory controller suitable for deciding a plurality of refresh cycles for respective combinations of the plurality of ranks and at least one program executed onto the memory device based on a performance diagnosis result of each of the ranks when the program is executed, and controlling a refresh operation to be performed onto the ranks based on the decided refresh cycles.

In accordance with another embodiment of the present invention, a method for controlling a memory system including a memory device provided with a plurality of ranks includes: performing an Error Correction Code (ECC) operation onto plural data stored in, or outputted from, at least one rank of the memory device in parallel; deciding a plurality of refresh cycles that respectively correspond to combinations of the plurality of ranks and at least one program executed onto the memory device based on a performance diagnosis result of each of the ranks when the program is executed; and controlling a refresh operation to be performed onto the at least one rank based on the decided refresh cycles to cure an ECC uncorrectable error while the ECC operation is performed.

DETAILED DESCRIPTION

Figure 1A:
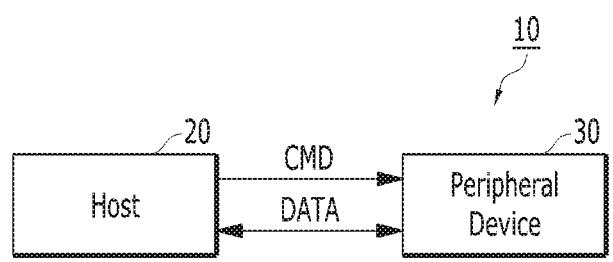
FIGS. 1A and 1B are block diagrams illustrating a data processing system.

Exemplary embodiments of the present invention will be described below in more detail with reference to the accompanying drawings. The present invention may, however, be embodied in different forms and should not be construed as limited to the disclosed embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the disclosure of the present invention.

Moreover, it is noted that the terminology used herein is for describing the examples only and is not intended to be limiting of the invention. As used herein, singular forms are intended to include the plural forms as well, unless the context clearly indicates otherwise. It will be further understood that the terms "comprises," "comprising," "includes" and/or "including" when used in this specification, are used interchangeably to indicate the presence of stated features, but do not preclude the presence or addition of one or more other non-stated features.

In the following description, numerous specific details are set forth in order to provide a thorough understanding of the present invention. The present invention may be practiced without some or all these specific details. In other instances, well-known process structures and/or processes have not been described in detail in order not to unnecessarily obscure the present invention.

Figure 1B:
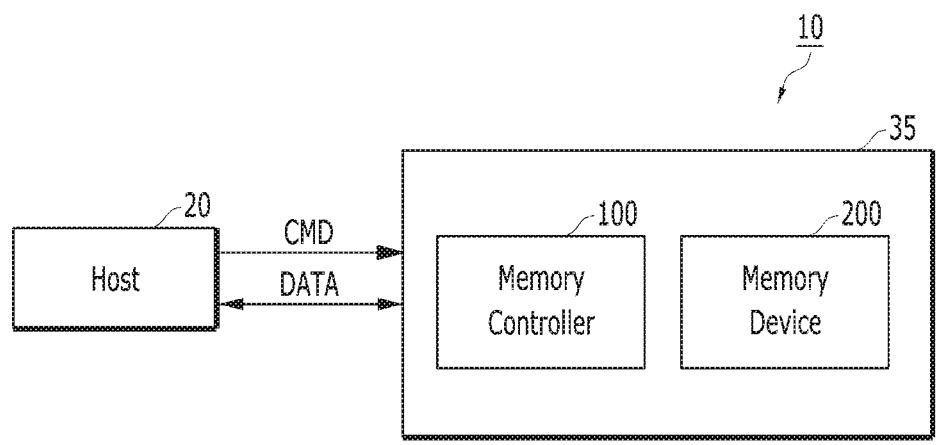

It is also noted, that in some instances, as would be apparent to those skilled in the relevant art, a feature or element described in connection with one embodiment may be used singly or in combination with other features or elements of another embodiment, unless otherwise specifically indicated FIGS. 1A and 1B are block diagrams illustrating a data processing system 10.

Referring to FIG. 1A, the data processing system 10 may include a host 20 and a peripheral device 30. The peripheral device 30 may receive a command CMD (or a request) from the host 20. The peripheral device 30 may transfer and receive data DATA according to the received command. By the way of example but not limitation, the host 20 may be a computer, a server, a smart phone and the like, while the peripheral device 30 may be a retrieval or permanently installed product.

Referring to FIG. 1B, the peripheral device 30 shown in FIG. 1A may be implemented with a memory system 35. The data processing system 10 may include a host 20 and memory system 35. The host 20 may be a portable electronic device such as a mobile phone, an MP3 player, a laptop computer and the like, or an electronic device such as a desktop computer, a game player, a television (TVs), a projector and the like.

The memory system 35 may be accessed in response to a command entered from the host 20. The memory system 35 may be used as a main memory unit or an auxiliary memory unit of the host 20.

The memory system 35 may include a memory controller 100 and a memory device 200. The memory controller 100 may perform an access operation to the corresponding memory device 200 in response to a command from the host 20. By the way of example but not limitation, the memory controller 100 may store write data from the host 20 in the memory device 200 in response to a write command from the host 20. In another example, the memory controller 100 may read data stored in the memory device 200 in response to a read command from the host 20. The memory controller 100 may transfer the read data to the host 20. According to diverse embodiments of the disclosure, the memory device 200 may be a volatile memory device such as a Dynamic Random Access Memory (DRAM), a Static Random Access Memory (SRAM) and the like. According to other embodiments of the disclosure, the memory device 200 may be a non-volatile memory device, such as a Read Only Memory (ROM), a Mask ROM (MROM), a Programmable ROM (PROM), an Erasable ROM (EPROM), an Electrically Erasable ROM (EEPROM), a Ferromagnetic Random Access Memory (FRAM), a Phase-change RAM (PRAM), a Magnetic RAM (MRAM), a Resistive RAM (RRAM), a flash memory and the like.

In a system including at least one memory device, faults in the memory devices may occur for different reasons. The faults that may occur additionally in an actual usage environment (which is referred to as 'additional defects', hereinafter) may be divided into intermittent faults and aging faults. The aging faults, such as Bias Temperature Instability (BTI) and a gate-oxide breakdown, may be considered defects that may be hardly recovered permanently as time passes. On the other hand, the intermittent faults may be defects that may occur due to variations in temperature, environment, manufacturing procedure and test bench characteristics. When an intermittent fault occurs, the memory cell including the intermittent fault may operate normally again after it is cured.

An error correction technology using a so-called Error Correction Code (ECC) may be used to solve the problem of the additional faults. However, as memory capacity increases and memories are used in a variety of environments such as the Internet of Things (IoT)/automotive, the additional faults are more likely to occur, resulting in ECC uncorrectable situations where faults are not corrected with an error correction code. Diverse techniques have been discussed to solve the problem of the ECC uncorrectable situations.

Among the diverse techniques is a method of adjusting a refresh rate (or a refresh cycle) of a memory device to reduce or minimize the number of faults. By the way of example but not limitation, when the memory device 200 shown in FIG. 1B is a DRAM, the memory controller 100 may monitor the ECC correction rate for the memory device 200 to increase the refresh rate (or decrease a unit refresh cycle) for the memory device 200.

The existing researches that minimize the faults of a memory through the adjustment of the refresh rate has the following limitations.

First, when the refresh rate is increased to reduce the intermittent faults of a memory device, the performance of a memory controller may be decreased, that is, the number of instructions and commands handled by the memory controller per unit time may be reduced.

Secondly, when only the refresh rate of a specific memory rank is increased, the degree of the use of a specific rank is reduced for the same program (or the same command set), resulting in an unbalanced use of a DRAM chip. Even if a failure occurs in only a single rank due to aging, the failure affects the reliability of the entire DRAM system. Therefore, it is necessary to use the ranks evenly to increase the system lifetime.

Thirdly, by shortening the refresh cycle, it is possible to reduce the frequency that ECC errors occur. However, adjusting the refresh cycle might not be effective on curing the aging faults significantly. Therefore, if the refresh cycle is shortened at every ECC correction, an unnecessary performance penalty may be caused. In other words, the memory controller needs to analyze the ECC trend to distinguish the types of faults, and to adjust the refresh cycle only for intermittent faults.

Figure 2:
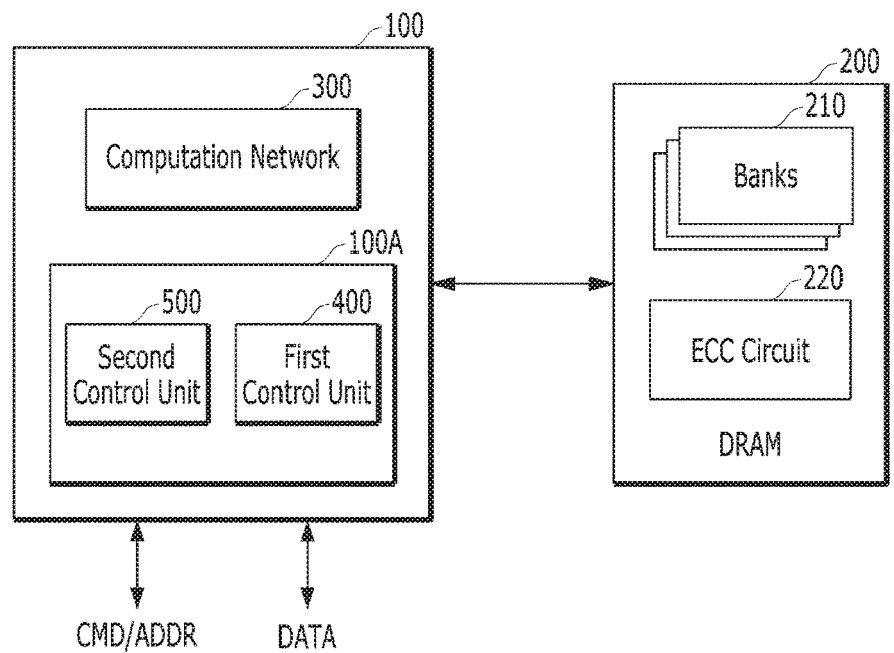
FIG. 2 is a block diagram illustrating a memory system in accordance with an embodiment of the present invention.

FIG. 2 is a block diagram illustrating a memory system in accordance with an embodiment of the present invention.

Referring to FIG. 2, the memory system may include a memory controller 100 and a memory device 200. The memory controller 100 may control the memory device 200 in response to an access request that is received from an external device, e.g., the host 20 of FIGS. 1A and 1B. The received request may include a single command, such as a read command or a write command, delivered into the memory device 200. Alternatively, the received request may include a combination of a plurality of memory commands, i.e., a command set, as a function for performing a specific function. Hereafter, the term "program" may include a command set, i.e., a combination of a plurality of memory commands.

By the way of example but not limitation, the program may include a wide range of a function or an application, such as surfing the Internet, playing a game, etc., that may be performed in the data processing system using the memory system 35 as illustrated in FIGS. 1A and 1B. For another example, the program may refer to a range of a function or an application, such as a background screen, a clock, etc., that may be performed in the data processing system. In another example, the program may include a random function or an incremental function for a narrow range of a function or an application that may be performed in the data processing system.

When the memory device 200 is a DRAM, the program may be constituted with a combination of commands, such as an active command ACT, a read command RD, and a write command WR.

The memory device 200 may operate in response to an access request from the memory controller 100. For example, in response to a write command from the memory controller 100, the memory device 200 may store data delivered from the memory controller 100 in its corresponding storage area. For another example, the memory device 200 may read a data stored in a storage area, corresponding to a read command, and transfer the read data to the memory controller 100 in response to the read command from the memory controller 100.

According to embodiments of the present invention, the memory device 200 may be a Dynamic Random Access Memory (DRAM). In this case, the memory device 200 may include a plurality of memory banks 210 as a memory storage area. Each of the memory banks 210 may be formed of a memory cell array including a plurality of memory cells that are coupled between word lines and bit lines. One memory bank may include one memory chip including a plurality of memory cells. A single memory rank may include a plurality of memory banks or a plurality of memory chips. By the way of example but not limitation, a rank of 8-bit wide DRAMs may include 8 memory chips, while a rank of 4-bit wide DRAMs may include 16 memory chips.

Also, the memory device 200 may perform an operation of correcting an error occurring while an operation is performed in response to an access request of the memory controller 100. The memory device 200 may include an error correction code (ECC) circuit 220. By the way of example but not limitation, the ECC circuit 220 may perform an error correction operation onto either a data to be written in a specific cell of the memory banks 210 or a data to be read from a specific cell of the memory banks 210.

The memory controller 100 may include a control unit 100A and a computation network 300. The control unit 100A may perform an operation corresponding to an access request from the outside (e.g., the host 20 of FIGS. 1A and 1B). By the way of example but not limitation, the control unit 100A may receive a command CMD and an address ADDR entered from the host 20. The control unit 100A may deliver a write data DATA corresponding to the received command and address into the memory device 200. The control unit 100A may receive a read data DATA corresponding to the received command and address from the memory device 200. The control unit 100A may include a first control unit 400 and a second control unit 500. The structure and operation of each of the first control unit 400 and the second control unit 500 will be described later.

According to the embodiments of the present invention, the memory controller 100 may consider the fact that the faults of the memory device 200 may be affected by process variations, environment/temperature, and a kind of a program (or a command set). To be specific, the memory controller 100 may consider the fact that the intermittent faults of the memory device 200, such as a DRAM, are dependent on the process variation for each DRAM rank, temperature/environment, and the kind of a command set to be executed. Also, the memory controller 100 may consider a factor that reduce or minimizes system performance degradation in adjusting or manipulating the refresh cycle for the memory device 200, such as a DRAM.

In other words, in order to predict a customized refresh cycle for the memory device 200, the memory controller 100 may consider a total of seven variables, which include the process variation for each memory rank, temperature/environment, the kind of a command set (or a program) executed, the total throughput of command sets processed by all memory ranks per unit time, a workload distribution of each memory rank per unit time, an additional fault rate (i.e., an ECC correction rate) occurring in real-time in an actual memory, and distinction between an aging fault and an intermittent fault. Considering the seven variables, the memory controller 100 may realize an eight-dimensional function for an output called a refresh cycle. Hereinafter, a case where the memory controller 100 considers the seven variables to predict the customized refresh cycle for the memory device 200 is exemplarily described. However, it should be noted that the spirit and concept of the disclosure are not limited to it.

As mentioned above, the intermittent faults in the memory device 200 may be affected by process variations, temperature/environment, and the like. The memory cells included in one memory rank may have a similar process variation. The memory cells included in another memory rank may generally have a similar process variation. Similarly, memory cells included in a memory rank may have similar temperature/environmental conditions. Therefore, when the memory controller 100 decides a refresh cycle for each memory rank, variables such as process variation for each rank, temperature/environment, etc., would be considered.

The memory controller 100 may include a computation network 300 for achieving a customized multidimensional function. The computation network 300 may be implemented based on a neural network structure. The neural network structure is a structure that may be used for an artificial intelligence, machine learning, neuromorphic processor and the like, to process a large amount of data in parallel. Also, the computation network 300 may predict or estimate an optimal refresh rate for the memory device 200 by using a parallel processing technique that existing variables and processing data are continuously accumulated and used. The memory controller 100, which may be realized through the structure, may enhance system reliability and system performance by estimating or predicting an optimal refresh rate that minimizes a CPU performance penalty.

Figure 3:
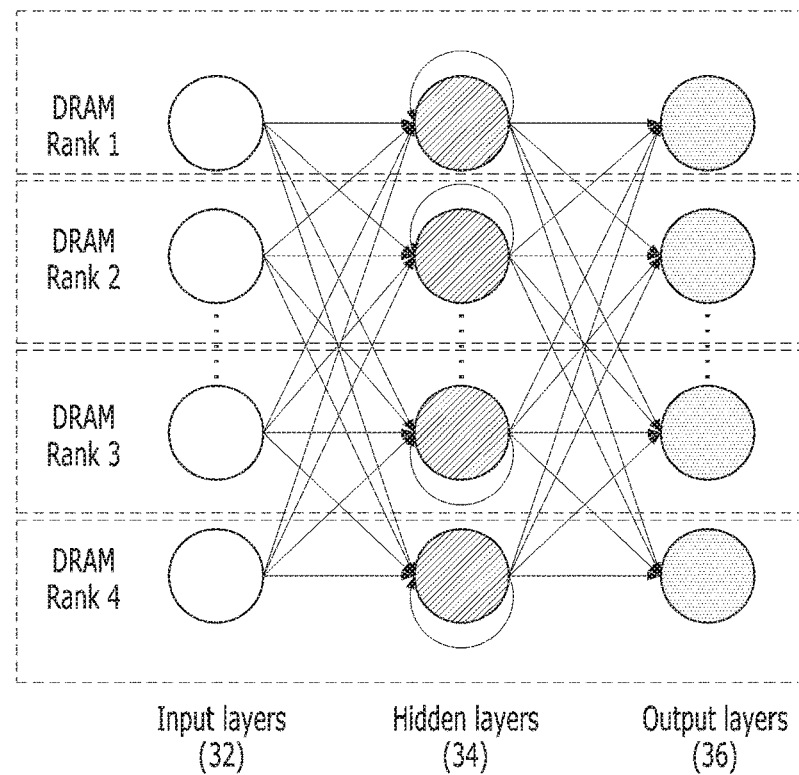
FIG. 3 illustrates a structure of a neural network implemented in a computation network in accordance with an embodiment of the present invention.

FIG. 3 illustrates a structure of a neural network that may be realized in a computation network 300 in accordance with an embodiment of the disclosure. The neural network that may be a so-called recurrent Neural Network (RNN) structure.

The RNN structure may include input layers 32, hidden layers 34, and output layers 36. Each layer may include a memory and a computer. The input layers 32 and the hidden layers 34 may collect and compute data, and the output layers 36 may compute desired parameter values. This RNN structure is advantageous in that a large amount of data is processed in parallel, and at the same time, power consumption is low even though a large amount of computation is performed, and that output layers may be able to predict optimal data by learning the data that are previously stored in the hidden layers.

The memory controller 100 of FIG. 2, which is realized to have the RNN structure, may represent a refresh rate for the memory device 200 with a total of seven variables, which include process variation for each memory rank, temperature/environment, the kind of a command set (or a program) executed, the total throughput of command sets processed by all ranks per unit time, a workload distribution of each rank per unit time, an additional fault rate (or ECC correction rate) occurring in real-time in an actual memory, and distinction between aging faults and intermittent faults. By the way of example but not limitation, the memory controller 100 may realize the computation network 300 in such a manner that the refresh rate for the memory device 200 is determined based on the seven variables.

Herein, the data on the total throughput of the command sets processed by all ranks per unit time and the data on the workload distribution for each rank per unit time are correlated with each other. Therefore, by using the RNN structure, the memory controller 100 may perform computation while correlating all data for each rank. In contrast, since a typical CPU has a serial processing structure, it may be difficult to connect all the data of each rank.

In FIG. 3, each of the y-axis (or vertical axis) layers is a layer for computing information of an independent memory rank. By the way of example but not limitation, the first upper layer on the y-axis may compute information on a DRAM rank 1. The second upper layer on the y-axis may compute information on the DRAM rank 2. The third upper layer on the y-axis may compute information on a DRAM rank 3. The fourth upper layer on the y-axis may compute information on a DRAM rank 4. This structure may represent process variation of different memory ranks.

Each of the hidden layers 34 on the x-axis (or the horizontal axis) may represent different kinds of programs (or kinds of command sets, drive time units), and temperature/environment. In other words, one vertical-axis layer unit may represent different kinds of program sets. In short, the number of the hidden layers 34 may correspond to the number of the kinds of programs in need of collecting information.

The input layers 32 and the output layers 36 are constituent elements corresponding to a control block 300B shown in FIG. 7, which will be described later. The hidden layers 34 are constituent elements corresponding to computation units 300A shown in FIG. 6.

Figure 4:
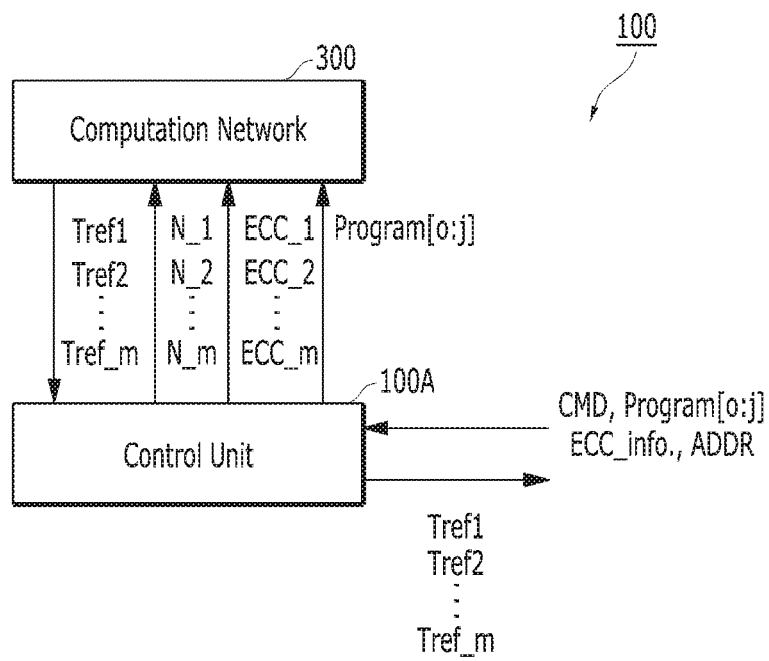
FIG. 4 illustrates a memory controller in accordance with an embodiment of the present invention.

FIG. 4 illustrates the memory controller 100 in accordance with an embodiment of the present invention.

Referring to FIG. 4, the memory controller 100 may include the control unit 100A and the computation network 300. The control unit 100A may receive the command CMD, program information Program[0:j], address information ADDR, and error correction information ECC_info. For example, the control unit 100A may receive the command CMD, the program information Program[0:j] and the address information ADDR from the host 20 shown in FIG. 1B, and receive the error correction information ECC_info. from the memory device 200 shown in FIG. 2. The control unit 100A may include two control units 400, 500 as shown in FIG. 2. In this case, the first control unit 400 may be a control unit included in a general memory controller, and the second control unit 500 may be a control unit for an operation linked with the computation network 300 according to the embodiments of the present invention. Alternatively, the control unit 100A may be formed to include a single control unit.

The computation network 300 may perform a computation to decide an optimal refresh cycle for each of the combinations of the memory ranks and programs. For this computation, the computation network 300 may receive program information Program[0:j], the number of ECC-corrected memory cells per m ranks ECC_1, ECC_2, ..., ECC_m, the number of commands performed per m ranks N_1, N_2, ..., N_m from the control unit 100A. Also, the computation network 300 may output refresh cycle information per rank Tref_1, Tref_2, ..., Tref_m according to a computation result into the memory device 200 shown in FIG. 2.

Key terms used to describe the diverse embodiments of the present invention may be defined as shown in TABLE 1 below.

TABLE 1

| No | Key symbols | Definition |
| --- | --- | --- |
| 1 | ADDR | Address |
| 2 | CMD | Command |
| 3 | ECC_info | ECC Information |
| 4 | ECC_1, ECC_2, ... ECC_m | Number of ECC-corrected memory cells per m ranks |
| 5 | ECC_ref1 | Counted number of ECC maximally allowed for rank 1 in a particular program |
| 6 | EN1, EN2, ... ENp | Enable signal for selecting p programs |
| 7 | N_1, N_2, ... N_m | Number of commands performed per m ranks |
| 8 | N_Average | Average number of commands performed by m ranks |
| 9 | N_critical | Average value of least command numbers performed by m ranks |
| 10 | Program[0:j] | Program information |
| 11 | Tref1, Tref2, ... Tref_m | Refresh cycle per m ranks |

Figure 5:
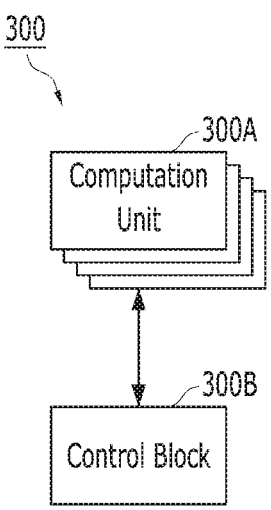
FIG. 5 is a block diagram illustrating a computation network in accordance with an embodiment of the present invention.

FIG. 5 is a block diagram illustrating the computation network 300 in accordance with an embodiment of the present invention.

Referring to FIG. 5, the computation network 300 may include a plurality of computation units 300A and a control block 300B. Each of the computation units 300A may include (m×p) computation units according to the combination of 'm' memory banks and 'p' programs. The control block 300B may receive the program information Program [0:j], the number of ECC-corrected memory cells per m ranks ECC_1, ECC_2, ..., ECC_m, and the number of commands performed per m ranks N_1, N_2, ..., N_m from the control unit 100A, and transfer them to the computation units 300A. Also, the control block 300B may receive refresh cycle information per rank Tref_1, Tref_2, ..., Tref_m according to the result of the computation performed by the computation units 300A from the computation units 300A. The control block 300B may transfer it to the control unit 100A shown in FIG. 4.

Figure 6:
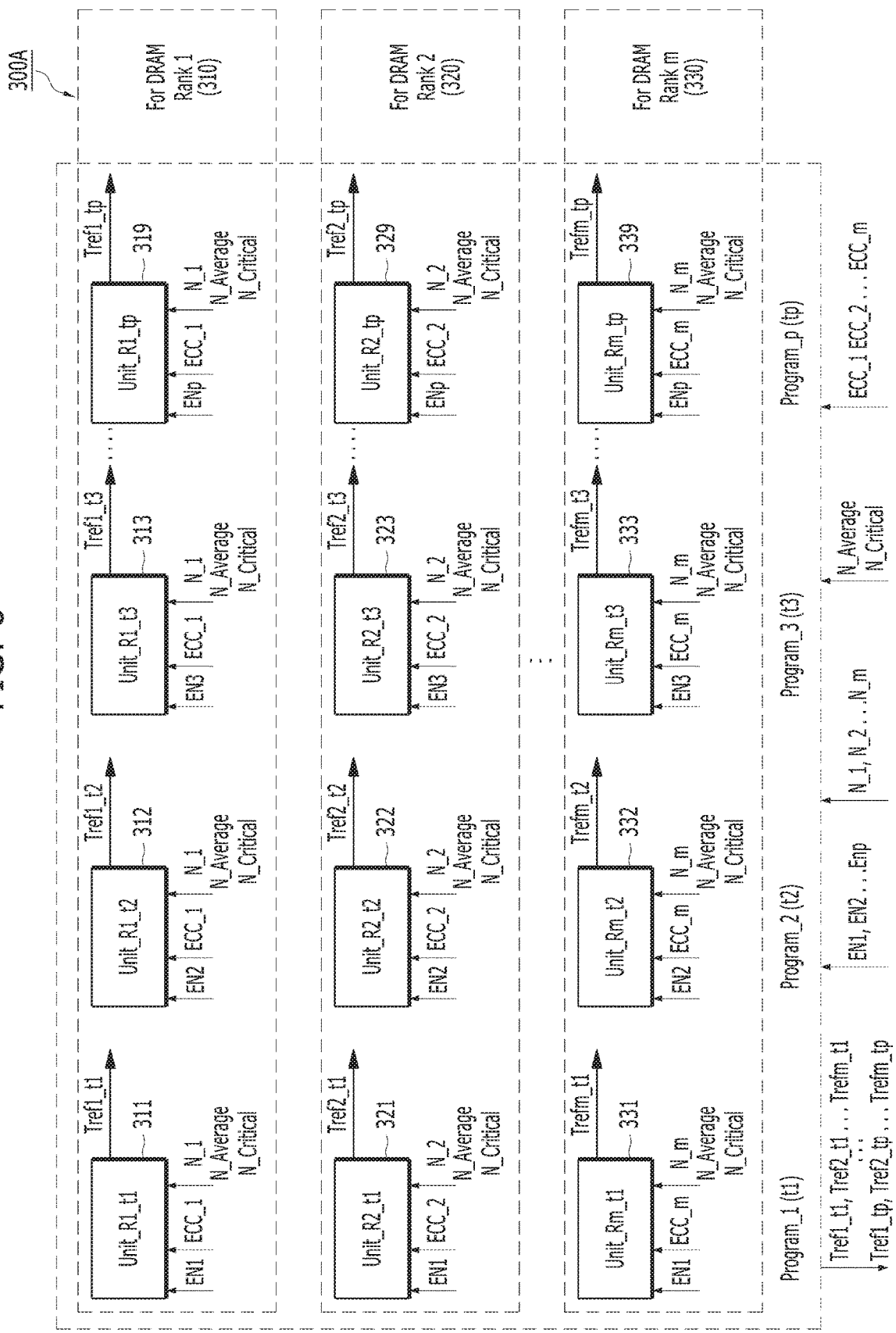
FIG. 6 is a block diagram illustrating computation units in accordance with an embodiment of the present invention.

FIG. 6 is a block diagram illustrating the computation units 300A in accordance with the embodiment of the present invention.

Referring to FIG. 6, the computation units 300A may include (m×p) computation units corresponding to combinations of 'm' memory ranks and 'p' programs. The computation units 300A may receive the values EN1 to Enp, N_1 to N_m, N_Average, N_Critical, ECC_1 to ECC_m from the control block 300B shown in FIG. 5 and perform the corresponding computation operation. Also, the computation units 300A may output the values Tref1_t1, Trefm_t1, Tref1_t2, ... Trefm_t2, ..., Tref1_tp, ..., Trefm_tp according to the result of the computation operation to the control block 3003.

Computation units 311 to 319 are computation units for a first DRAM rank 310. Computation units 321 to 329 are computation units for a second DRAM rank 320. Computation units 331 to 339 are computation units for a third DRAM rank 330. The computation units 311, 321, 331 are computation units for a first program Program_1. The computation units 312, 322, 332 are computation units for a second program Program_2. The computation units 313, 323 and 333 are computation units for a third program Program_3. The computation units 319, 329, 339 are computation units for a $p^{th}$ program Program_p.

The computation unit 311 may receive the values EN1, ECC_1, N_1, N_Average, N_Critical, perform a computation operation in response to the received values, and output the value Tref1_t1. The other computation units 312, 313, 319 for the first DRAM rank 310 may perform a similar computation operation. The computation unit 321 may receive the values EN1, ECC_2, N_2, N_Average, N_Critical, performs a computation operation in response to the received values, and output the value Tref2_t1. The other computation units 322, 323, 329 for the second DRAM rank 320 may perform a similar computation operation. The computation unit 331 may receive the values EN1, ECC_, N_m, N_Average, N_Critical, performs a computation operation in response to the received values, and output Trefm_t1. The other computation units 332, 333, 339 for the $m^{th}$ DRAM rank 330 may perform a similar computation operation.

Referring back to FIGS. 2, 4, 5 and 6, the computation network 300 may include the computation units 300A for performing a unit computation and the control block 300B for indirectly coupling all the computation units in parallel. There are layers from the DRAM rank 1 Unit_R1_t1 to Unit_R1_tp to the DRAM rank m Unit_Rm_t1 to Unit_Rm_tp on the horizontal axis of each computation unit 300A. The vertical axes of the computation units 300A may be grouped according to the kind of a program set. The unit of the program set may be freely set by a user. The group of computation units Unit_R1_t1, Unit_R2_t1, ..., Unit_Rm_t1 on the first vertical axis may include the ranks performed in a unit program 1. There are 'p' groups of computation units, which may store information corresponding to 'p' program sets.

Each of the computation units may receive an EN signal EN1 to ENp for notifying a selection of a particular program, the cumulatively counted number of ECC-corrected errors per rank ECC_1, ..., ECC_m that occur while a corresponding unit program is executed, the cumulative number of commands N_A, N_2, ..., N_m performed by each rank during a set operation of the unit program, the average number N_Average of commands performed by m ranks during the set operation of the unit program, and the average value N_critical of the least numbers of commands performed by the m ranks. Also, the computation units may output the refresh cycle Tref1_t1, ..., Trefm_tp for each program of each rank.

In other words, the values inputted to the computation units 300A are real-time parameters that the control unit 100A has measured and received from the memory device 200. Each of the computation units may continuously accumulate the input values in registers (e.g., the register unit 940 shown in FIG. 10) and learn and perform self-computation to decide refresh cycles for each rank and each program, which is 'm×p' Tref values where 'm' represents the total number of ranks and 'p' represents the number of program sets. The information on the refresh cycles that are decided as above may be transferred to the first control unit 400 through the second control unit 500. The first control unit 400 may allow refresh operations to be performed for the ranks corresponding to the memory device 200 based on the information on the received refresh cycles. For example, when the total number of the ranks is 8 and the number of the program sets is 10, the computation units 300A may output information on approximately 80 refresh cycles.

Figure 7:
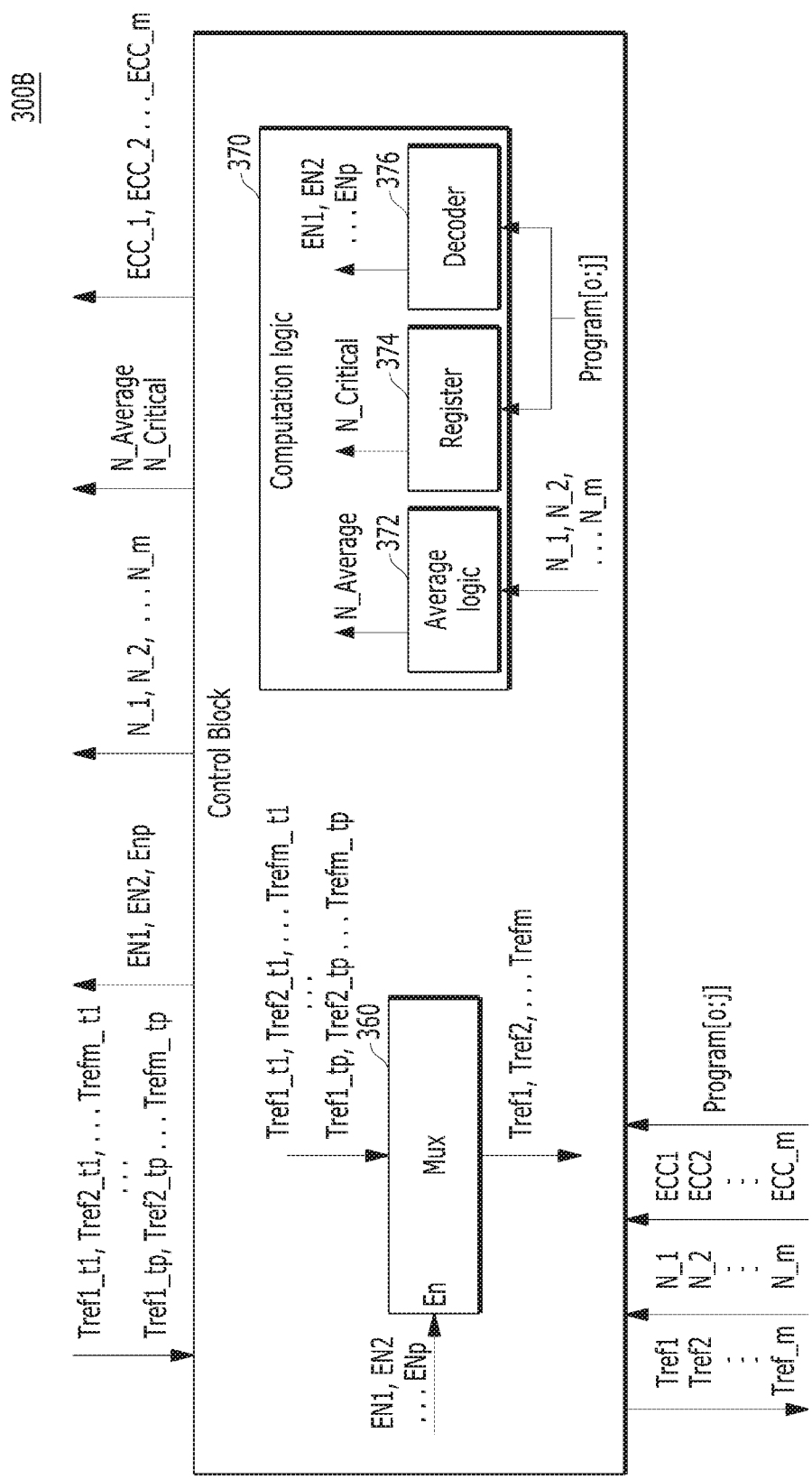
FIG. 7 is a block diagram illustrating a control block in accordance with an embodiment of the present invention.

FIG. 7 is a block diagram illustrating the control block 300B in accordance with the embodiment of the present invention.

Referring to FIG. 7, the control block 300B may include a multiplexer MUX 360 and a computation logic 370. The control block 300B may receive the values of program[0:j], ECC_1, ..., ECC_m, N_1, ..., N_m from the control unit 100A shown in FIG. 4. The control block 300B may output the values of EN1, ..., ENp, N_1, ..., N_m, N_Average, N_Critical, ECC_1, ECC_m into the computation units 300A shown in FIG. 6. Also, the control block 300B may receive the values of Tref1_t1, ..., Trefm_t1, Tref1_t2, ..., Trefm_t2, ..., Tref1_tp, ..., Trefm_tp from the computation units 300A. The control block 300B may output the values of Tref1, Tref2, ..., Tref_m into the control unit 100A shown in FIG. 4.

The multiplexer MUX 360 may receive the values of Tref1_t1, Tref1_t1, ..., Trefm_t1, Tref1_t2, Tref2_t2, ..., Trefm_t2, ..., Tref1_tp, Tref1_tp, ..., Trefm_tp, and output Tref1, Tref2, ..., Trefm in response to EN1, EN2, ..., ENp.

The computation logic 370 may include an average logic 372, a register 374, and a decoder 376. The averaging logic 372 may receive N_1, N_2, ..., N_m, take an average value of them, and output the value N_Average. The register 374 may receive the value Program[0:j] and output the value N_Critical. The decoder 376 may receive the value Program [0:j] and output the values EN1, EN2, ..., ENp for selecting a particular program.

Referring back to FIGS. 4, 5 and 7, the control block 300B in the computation network 300 may connect and control all the computation units 300A. The computation logic 370 in the control block 300B may receive the program information for the memory device 200 executed by the first control unit 400 of FIG. 2 and generate enable signals EN1, EN2, ..., ENp for selecting a computation unit in the computation network 300 corresponding to a specific program through the decoder 376. Also, the computation logic 370 may take an average value of the cumulatively counted numbers N_1, N_2, ..., N_m of the command sets of each rank performed to execute a corresponding program set through the average logic 372 to output the value N_Average. Also, the computation logic 370 may output the average value N_critical of the least numbers of commands to be necessarily processed by m ranks for each program, which is updated in the register 374.

When a particular program set is executed in response to the enable signals EN1, EN2, ..., ENp generated by the decoder 376, the multiplexer 360 in the inside of the control block 300B may multiplex (m×p) Tref output values outputted from the computation units 300A into m Tref (Tref1, Tref2, ..., Trefm).

Figure 8:
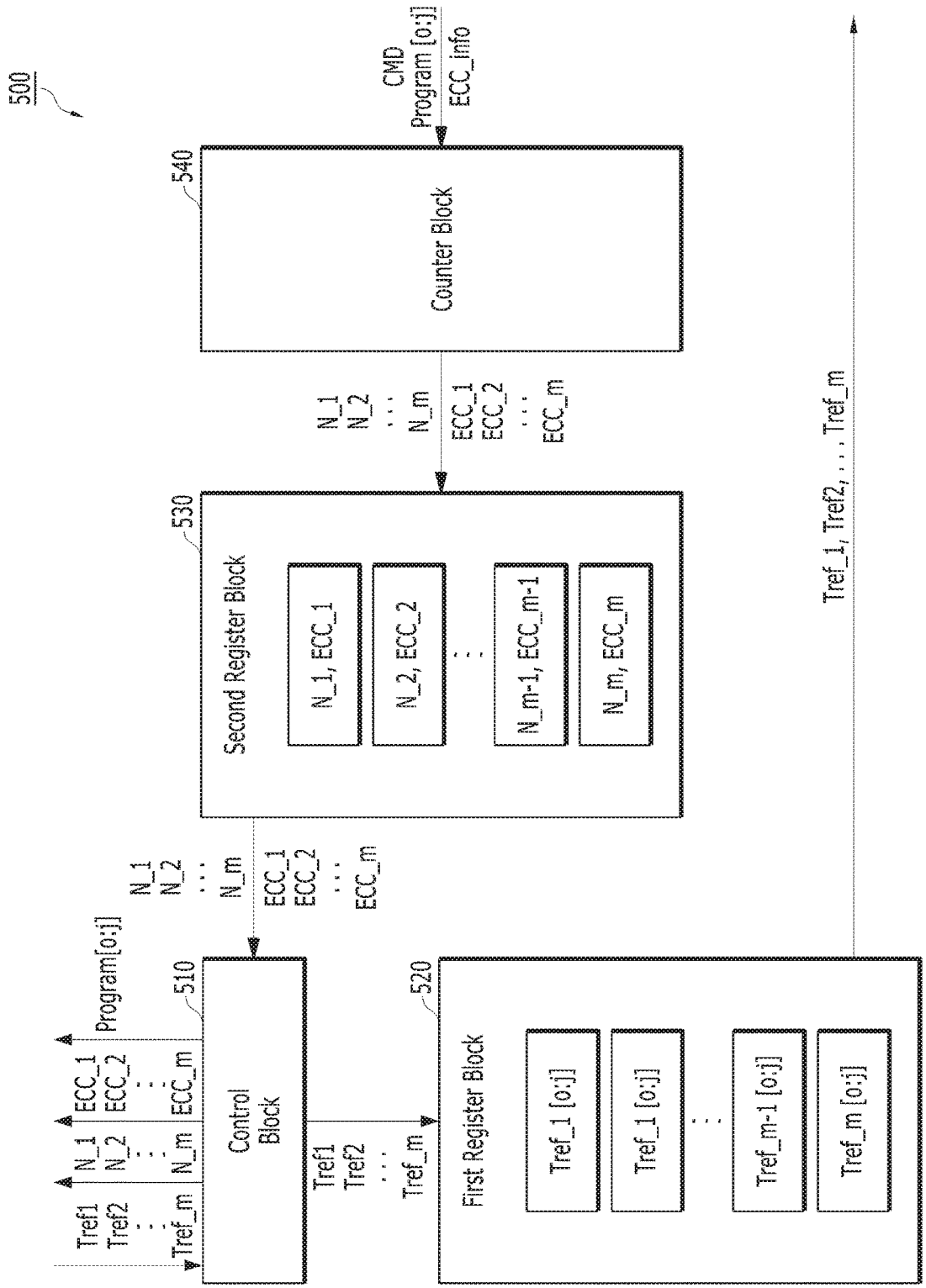
FIG. 8 is a block diagram illustrating a second control unit in accordance with an embodiment of the present invention.

FIG. 8 is a block diagram illustrating a second control unit 500 in accordance with an embodiment of the present invention.

Referring to FIG. 8, the second control unit 500 may include a control block 510, a first register block 520, a second register block 530, and a counter block 540.

The counter block 540 may receive the values CMD, Program[0:j], and ECC_info. from the first control unit 400. Also, the counter block 540 may perform a count operation on the commands CMDs for each rank, and transfer the values N_1, N_2, ..., N_m to the second register block 530 based on the result of the count operation. Also, the counter block 540 may perform a count operation on the value ECC_info. for each rank, and transfer the values ECC_1, ECC_2, ..., ECC_m to the second register block 530 based on the result of the count operation.

The register block 530 may store the values N_1, N_2, ..., N_m, ECC_1, ECC_2, ..., ECC_m that are transferred from the counter block 540 for each rank.

The control block 510 may receive the values N_1, N_2, ..., N_m, ECC_1, ECC_2, ..., ECC_m stored in the second register block 530, and receive the values Tref_1, Tref_2, ..., Tref_m from the computation network 300. Also, the control block 510 may transfer the values Program [0:j], N_1, N_2, ..., N_m, ECC_1, ECC_2, ..., ECC_m to the computation network 300 and transfer the values Tref_1, Tref_2, ..., Tref_m to the first register block 520.

The first register block 520 may store the values Tref_1, Tref2, ..., Tref_m from the control block 510. The values Tref_1, Tref_2, ..., Tref_m stored in the first register block 520 may be transferred to the first control unit 400.

Referring back to FIGS. 2, 4 and 8, the second control unit 500 may receive the command CMD, program information (or a unit command set), and ECC information from the first control unit 400. The counter block 540 may include a command counter and an ECC counter to count the number N_1, N_2, ..., N_m of commands executed by m ranks in a unit program and the total number ECC_1, ECC_2, ..., ECC_m of ECC corrections for 'm' ranks occurring in the unit program. The second register block 530 may store the number of commands and the ECC information for each rank. The first register block 520 may store refresh cycles Tref_1, Tref_2, ..., Tref_m computed by the computation network 300 for each rank.

Figure 9:
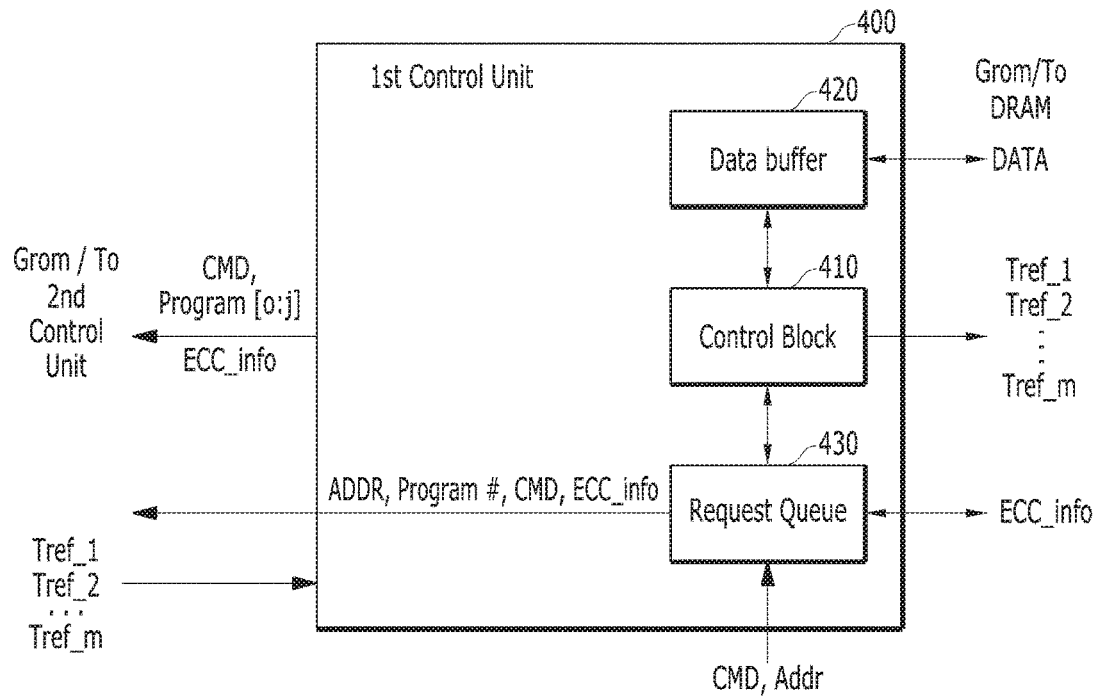
FIG. 9 is a block diagram illustrating a first control unit in accordance with an embodiment of the present invention.

FIG. 9 is a block diagram illustrating the first control unit 400 in accordance with the embodiment of the present invention.

Referring to FIG. 9, the first control unit 400 may include a control block 410, a data buffer 420, and a request queue 430. The data buffer 420 may store a data, which is received from an external device (e.g., host 20) to be stored in the memory device 200, or receive a data from the memory device 200. The data stored in the data buffer 420 may also be transferred to the external device (e.g., host 20).

The request queue 430 may receive and store the value ECC_info. from the memory device 200. Also, the request queue 430 may receive and store, a command CMD and an address ADDR entered from the external device (e.g., the host 20).

The control block 410 may receive the values Tref_1, Tref_2, ..., Tref_m from the second control unit 500 and transfer them to the memory device 200. Also, the control block 410 may control the request queue 430 to transfer the signals CMD, Program[0:j], ECC_info, ADDR to the second control unit 500.

Figure 10:
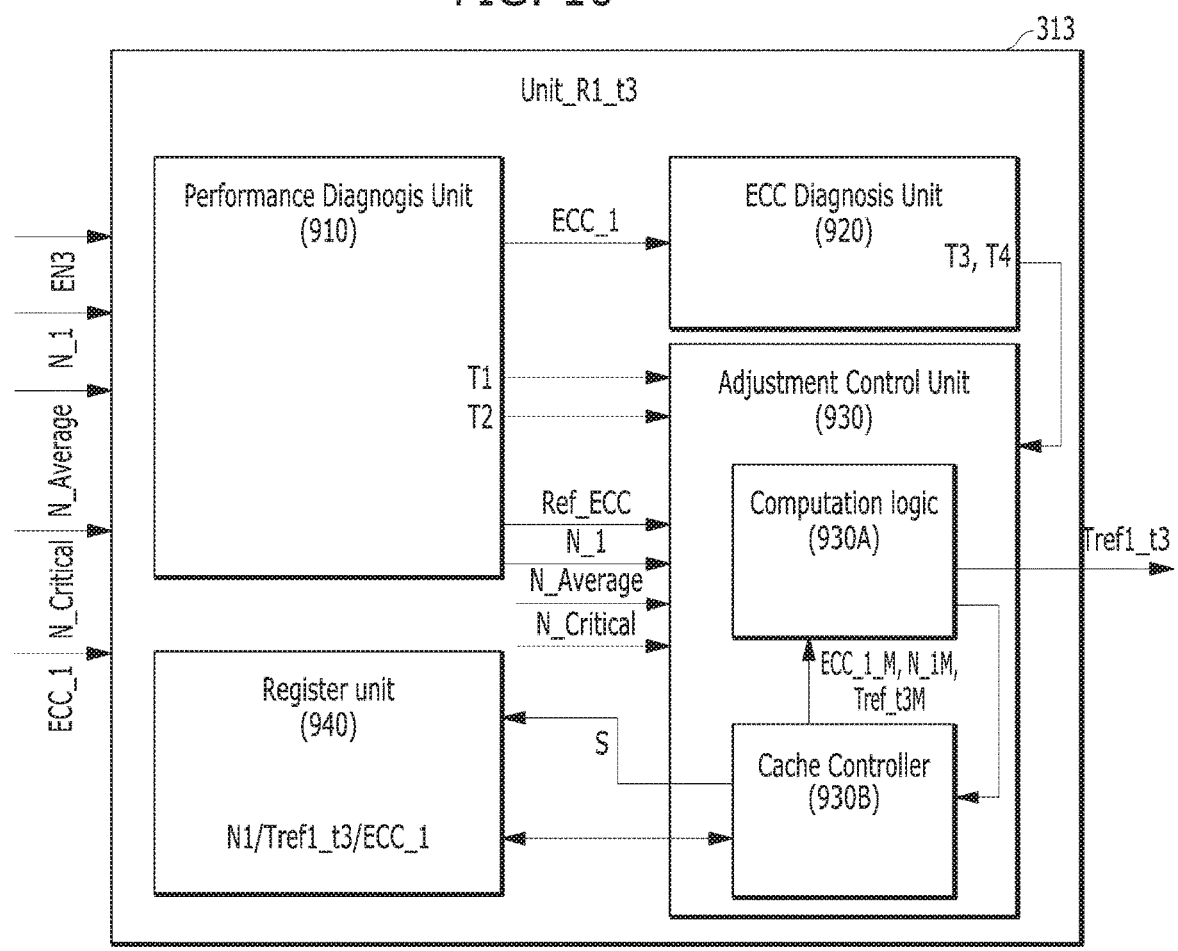
FIG. 10 is a block diagram illustrating a computation unit in accordance with the embodiment of the present invention.

FIG. 10 is a block diagram illustrating a computation unit 313 in accordance with the embodiment of the disclosure. Although FIG. 10 exemplarily illustrates a structure of the computation unit 313 among the computation units that are included in the computation network 300, it is obvious to those skilled in the art that the other computation units may have a similar structure and perform a similar operation.

Referring to FIG. 10, the computation unit 313 may include a performance diagnosis unit 910, an ECC diagnosis unit 920, an adjustment control unit 930, and a register unit 940. The computation unit 313 may receive the values EN3, N_1, N_Average, N_Critical, ECC_1 from the control block 300B and transfer Tref1_t3 to the control block 300B. The register unit 940 may be represented by SRAM and FF/Latch.

Referring back to FIGS. 4, 5, 6, 7 and 10, in a single unit Unit_R1_t3 (i.e., the computation unit 313) included in the computation units 300A, 'R1' may represent a rank 1, while 't3' may represent a program set 3. The unit Unit_R1_t3 (i.e., the computation unit 313) may include the register unit 940 that stores past information N_1, Tref1_t3, ECC_1, the performance diagnosis unit 910 that diagnoses whether a performance drop occurs or not, the ECC diagnosis unit 920 that decides the extent of a current ECC failure, and the adjustment control unit 930. The adjustment control unit 930 may decide a refresh cycle that minimizes performance overhead and ECC failure rate by analyzing a trend table of the information of the past information N_1, Tref1_t3, ECC_1, distinguishing aging faults and intermittent faults from each other, and learning the past information.

The performance diagnosis unit 910 may receive the values N_Average and N_Critical, and output signals T1 and T2 according to the diagnosis result. The ECC diagnosis unit 920 may receive the value ECC_1 and output signals T3 and T4 according to the diagnosis result. The register unit 940 may store the past information N1, Tref1_t3 and ECC_1 that are received from the adjustment control unit 930, and also transfer the stored the past information N1, Tref1_t3 and ECC_1 to the adjustment control unit 930. The storing and transferring operations performed by the register unit 940 may be performed in response to a selection signal S.

The adjustment control unit 930 may receive the values ECC_1, N_1, N_Average and N_Critical from the control block 300B, receive the signals T1 and T2 from the performance diagnosis unit 910, receive the signals T3 and T4 from the ECC diagnosis unit 920, and output the value Tref1_t3 to the control block 300B. The adjustment control unit 930 may include a computation logic 930A and a cache controller 930B.

Figure 11:
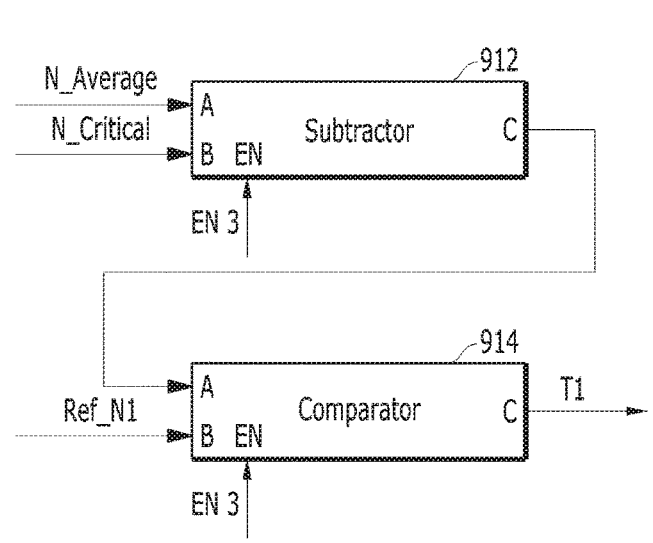
FIG. 11 is a block diagram illustrating a performance diagnosis unit in accordance with an embodiment of the present invention.
Figure 11:
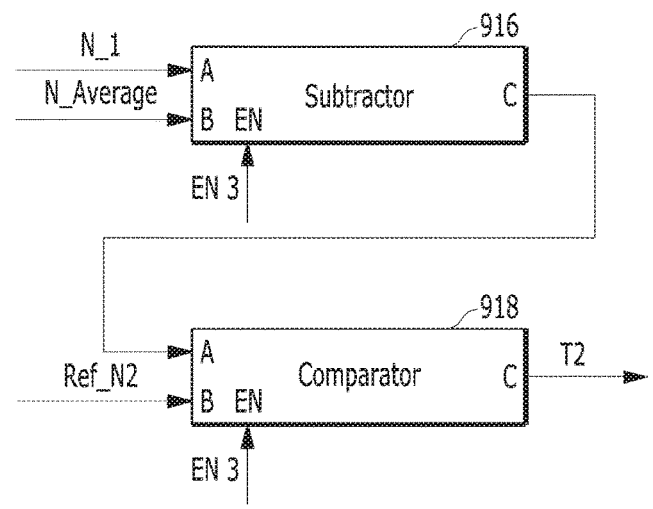

FIG. 11 is a block diagram illustrating the performance diagnosis unit 910 in accordance with the embodiment of the present invention.

Referring to FIG. 11, the performance diagnosis unit 910 may include subtractors 912, 916 and comparators 914, 918. The subtractors 912, 916 and the comparators 914, 918 may be enabled in response to the value EN3. The subtractor 912 may receive the values N_Average and N_Critical, perform a subtraction operation onto the received signals, and output the subtraction result to the comparator 914. The comparator 914 may compare the subtraction result from the subtractor 912 with the reference value Ref_N1 and output a comparison result T1. The subtractor 916 may receive the values N_1 and N_Average, perform a subtraction operation onto the received signals, and output the subtraction result to the comparator 918. The comparator 918 may compare the subtraction result from the subtractor 916 with the reference value Ref_N2 and output the comparison result T2.

The performance diagnosis unit 910 described above may decide whether the average value N_Average of the number of command sets performed by all ranks when a corresponding program set is executed is less than a reference throughput the average value N_critical. If a value of {N_Critical−

N_Average} is greater than the reference value Ref_N1, the performance diagnosis unit 910 may decide that the performance penalty is large due to too low a refresh cycle. In this case, the performance diagnosis unit 910 may generate a comparison result T1 of a logic high level (which is referred to as 'H', hereinafter), e.g., 5V.

When the command throughput the values N_1 of the rank 1 is significantly smaller than those of the other ranks, it is required to raise the refresh cycle. When the value of {N_Average-N_1} is greater than the reference value Ref_N2, the performance diagnosis unit 910 may decide that the reference value refresh cycle of the rank 1 is too short for other ranks. In this case, the performance diagnosis unit 910 may generate the signal T2 of a logic high level H. When the EN3 signal is enabled, that is, when the corresponding program number is executed, the constituent elements included in the performance diagnosis unit 910 operate. If the second rank schedule distribution function does not need to be executed in one program set, the reference value Ref_N2 in FIG. 11 may be adjusted and not used.

Figure 12:
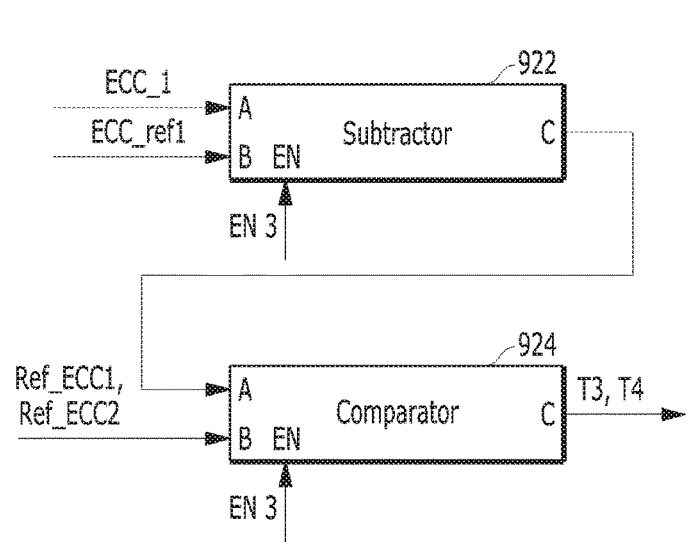
FIG. 12 is a block diagram illustrating an Error Correction Code (ECC) diagnosis unit in accordance with an embodiment of the present invention.

FIG. 12 is a block diagram illustrating the ECC diagnosis unit 920 in accordance with the embodiment of the present invention.

Referring to FIG. 12, the ECC diagnosis unit 920 may include a subtractor 922 and a comparator 924. The subtractor 922 and the comparator 924 may be enabled in response to EN3. The subtractor 922 may receive the values ECC_1 and ECC_ref, perform a subtraction operation onto the received signals, and output a subtraction result Ref_ECC1 to the comparator 924. The comparator 924 may compare the subtraction result Ref_ECC1 transferred from the subtractor 922 with the value Ref_ECC2, and output the comparison results T3 and T4.

The ECC diagnosis unit 920 may adjust the refresh rate or cycle only in certain cases by comparing the level of the number of the current ECC failures with a maximum tolerance value. The adjustment of the refresh cycle may be divided into two cases.

A first case is when the performance diagnosis unit 910 sends a command to raise the refresh cycle, i.e., when the signals T1 or T2 is at a logic high level 'H'. In this case, the ECC diagnosis unit 920 may control the refresh cycle to be raised only when the current value ECC_ref1 (the maximally allowable number of ECC counts for the rank 1 in one program)−ECC_1 (the number of ECC counts accumulated from the rank 1 in one current program set)>Ref_ECC2 value. In this case, even if the ECC failure rate is increased by raising the refresh cycle, it is predicted that the value ECC_ref1 will not be reached. Therefore, the ECC diagnosis unit 920 may generate the signal T3 of a logic high level 'H'.

The second case is when the refresh cycle is long enough, that is, when both the signals T1 and T2 are at a logic low level because there is no performance overhead. In this case, it is decided whether to tune the refresh cycle or not based on {(ECC_ref−ECC_1)<Ref_ECC2}. This means that the current ECC rate is too high. In this case, it is necessary to shorten the refresh rate to decrease the value ECC_1 and lower the failure rate. Therefore, the signal T4 of a logic high level ° H' may be outputted. When the failure rate is high, that is, when the ECC rate is high, the refresh cycle is decreased. When the refresh cycle is decreased so low that performance drop occurs, the refresh cycle may be raised through a continuous iteration loop to adjust the refresh cycle value optimally according to a new environment and temperature.

If the refresh cycle needs to be adjusted as described above, it may be difficult to decide how much the refresh cycle needs to be adjusted. To maximize the accuracy, the adjustment control unit 930 may store the previously used information N_1, Tref1_t3 and ECC_1 in the internal register unit 940, which may be realized in a form of a lookup table, read it again. The adjustment control unit 930 may compare the current information with the previous information to find the optimal refresh cycle value.

If the performance diagnosis unit 910 and the ECC diagnosis unit 920 provide a command to change the refresh cycle, the adjustment control unit 930 may read a past lookup table stored in the register unit 940, decide whether the faults of the memory device are aging faults or intermittent faults, and find the most optimal refresh cycle value through learning.

Figure 13:
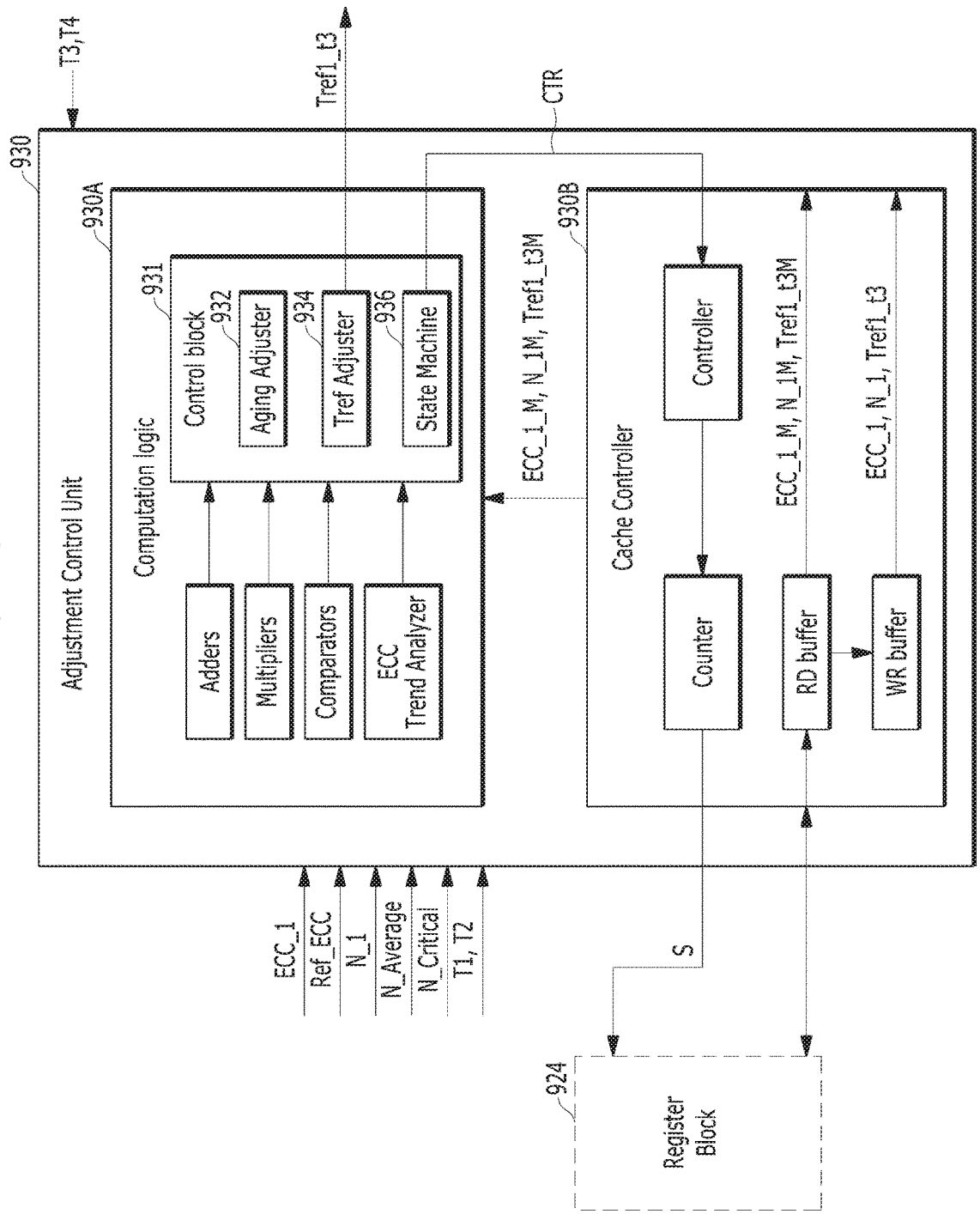
FIG. 13 is a block diagram illustrating an adjustment control unit in accordance with an embodiment of the present invention.

FIG. 13 is a block diagram illustrating the adjustment control unit 930 in accordance with the embodiment of the present invention.

Referring to FIG. 13, the adjustment control unit 930 may include the computation logic 930A and the cache controller 930B. The adjustment control unit 930 may receive the values ECC_1, N_1, N_Average, N_Critical from the control block 300B, receive the signals T1 and T2 from the performance diagnosis unit 910, receive T3 and T4 from the ECC diagnosis unit 920, and output the value Tref1_t3 to the control block 300B.

The computation logic 930A may include a control block 931 and auxiliary components for assisting the operation of the control block 931. By the way of example but not limitation, the auxiliary components may include adders, multipliers, comparators, and an ECC trend analyzer. The control block 931 may include an aging adjuster 932, a refresh (Tref) adjuster 934, and a state machine 936.

The cache controller 930B may include a controller, a counter, a read buffer, and a write buffer. The controller may receive an output of the state machine 936 of the control block 931 and output a signal CTR. The counter may perform a count operation in response to the signal CTR from the controller and output an S signal to the register unit 940. The read buffer may read and store the previously used information ECC_1, N_1 Tref1_t3 stored in the register unit 940 in response to the signal CTR from the controller, and output the values ECC_1_M, N_1M and Tref1_t3M to the computation logic 930A. The write buffer may receive and store the values ECC_1_M, N_1M, and Tref1_t3M in response to the signal CTR from the controller, and write the values ECC_1_M, N_1M, and Tref1_t3M in the register unit 940.

Figure 14:
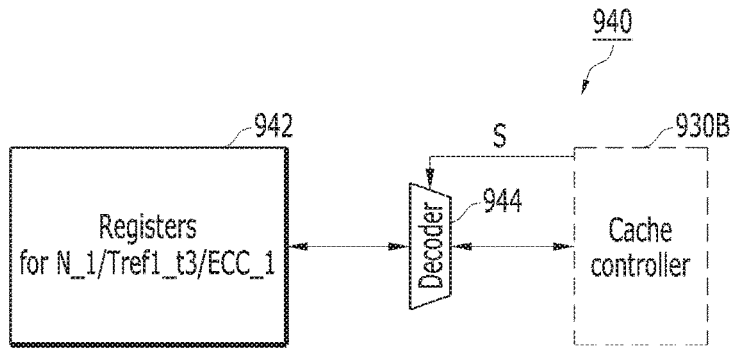
FIG. 14 is a block diagram illustrating a register unit in accordance with an embodiment of the present invention.

FIG. 14 is a block diagram illustrating the register unit 940 in accordance with the embodiment of the present invention.

Referring to FIG. 14, the register unit 940 may include registers 942 and a decoder 944. The registers 942 may be programmed with the previously used information ECC_1, N_1, Tref1_t3 from the cache controller 930B. Also, the registers 942 may allow the previously used information ECC_1, N_1, Tref1_t3 stored therein to be read by the cache controller 930B. The decoder 944 may allow a write operation or a read operation to be performed by the cache controller 930B in response to the signal S transferred from the cache controller 930B.

Figure 15:
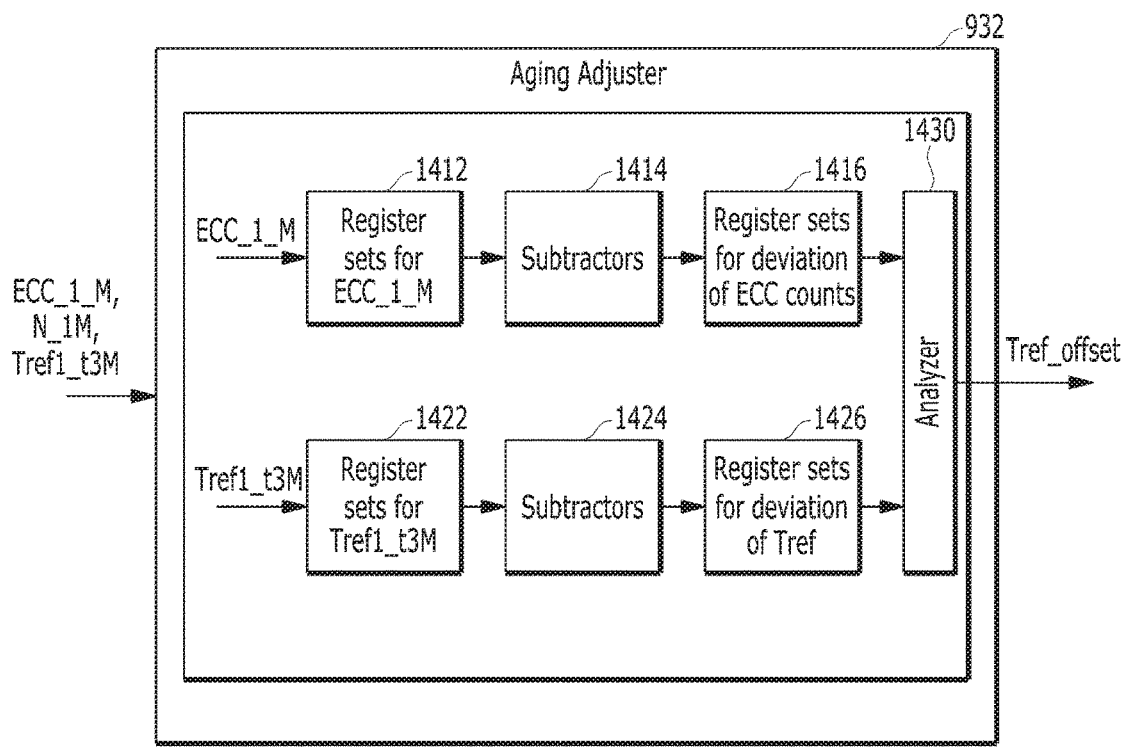
FIG. 15 is a block diagram illustrating an aging adjuster in accordance with an embodiment of the present invention.

FIG. 15 is a block diagram illustrating the aging adjuster 932 in accordance with the embodiment of the present invention.

Referring to FIG. 15, the aging regulator 932 may include register sets 1412, 1422, subtractors 1414, 1424, register sets 1416, 1426, and an analyzer 1430. The aging regulator 932 may receive ECC1_M, N_1M, and Tref1_T3M from the control block 300B, and analyze the tendency of the ECC count number and the tendency of the refresh cycle to grasp the extent of aging. The aging regulator 932 may decide whether the faults for the memory cells are aging faults or intermittent faults according to the extent of aging, and output a signal Tref_offset according to the decision result.

The register sets 1412 may receive and store the values ECC_1_M. The subtractors 1414 may perform a subtraction operation onto the values ECC_1_M stored in register sets 1412. The register sets 1416 may store the variation amount between different cycles (or sections) of the ECC correction cumulative count number according to the subtraction operation.

Register sets 1422 may receive and store the values Tref1_t3M. The subtractors 1424 may perform a subtraction operation onto the values Tref_1_t3M stored in the register sets 1422. The register sets 1426 may store the variation amount between different cycles (or sections) of the refresh cycle according to the subtraction operation.

The analyzer 1430 may decide the extent of aging based on the variation amount between the different cycles of the ECC correction cumulative count number and the variation amount between the different cycles of the refresh cycle. In deciding the extent of aging, the analyzer 1430 may decide the extent of aging based on the average value of the variation amounts between different cycles for the ECC correction cumulative count number and the refresh cycle.

Referring back to FIG. 10 and FIGS. 13 to 15, the adjustment control unit 930 may include the cache controller 930B for performing a read operation of past data stored in the register unit 940 and a write operation of data currently changed in the register unit 940, and a computation logic 930A that finally outputs a refresh cycle by analyzing the corresponding data.

The computation logic 930A may figure out whether the faults for memory cells are aging faults or intermittent faults by analyzing the trend of the past ECC correction cumulative count numbers through an ECC trend analysis and analyzing the tendency of the refresh cycle. The control block 931 may analyze {(the variation amount between the different cycles of the ECC correction cumulative count number of the rank 1)/(the variation amount between different cycles of the refresh cycle)}. If the analysis value continues to increase, the control block 931 may figure out the extent of the aging faults. An aging fault or failure is a permanent failure in which the failure rate is not reduced although the extent of the aging faults is decreased. If it is decided that the extent of the aging faults is high, the aging adjuster 932 of the control block 931 may adjust the refresh cycle by appropriately setting the signal Tref_offset to reduce the extent of the aging faults.

When the signals T1 and T3 of a logic high level 'H' (e.g., 5V) are generated, that is, when the throughput of all ranks is small and the refresh cycle is adjustable, the adjustment control unit 930 may set the value Tref_1_t3 in which {m*N_Critical−N_average} makes N_1 most similar to the reference value Ref_N1 as illustrated in FIG. 11. Herein, the adjustment control unit 930 may search the existing data stored in the lookup table of the register unit 940 and set it as a new value Tref_1_t3.

When the signals T2 and T3 of a logic high level 'H' are generated, that is, when the throughput of the commands of a corresponding rank is lower than those of the other ranks and at the same time, the refresh cycle is adjustable, the adjustment control unit 930 may set the value of Tref_1_t3 in which (N_average−N_1) makes N_1 most similar to Ref_N2. Herein, the adjustment control unit 930 may search the existing data stored in the lookup table of the register unit 940 and set it as a new value Tref_1_t3.

When T4 of a logic high level 'H' is generated, that is, when the ECC failure rate is too high, the adjustment control unit 930 may set the value Tref_1_t3, in which (ECC_ref1−ECC_1) makes the value ECC_1 most similar to the value Ref_ECC2 as illustrated in FIG. 12. Herein, the adjustment control unit 930 may search the existing data stored in the lookup table of the register block 940. The adjustment control unit 930 may set it as a new value Tref_1_t3.

When the final refresh cycle is decided, the adjustment control unit 930 may update a corresponding data set into the lookup table of the register unit 940.

Figure 16:
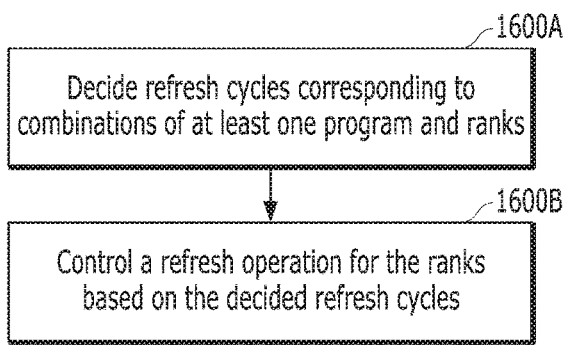
FIG. 16 is a flowchart describing an operation of adjusting a refresh cycle for a memory device in accordance with an embodiment of the present invention.

FIG. 16 is a flowchart describing an operation of adjusting a refresh cycle for a memory device in accordance with the embodiment of the present invention. The flow shown in FIG. 16 may be performed by the memory controller 100, which includes the control unit 100A and the computation network 300, controlling the memory device 200, which includes a plurality of ranks, as illustrated in FIGS. 2 to 15.

Referring to FIG. 16, the memory controller 100 may perform an operation of deciding a plurality of refresh cycles corresponding to combinations of at least one program and a plurality of ranks, respectively, in step 1600A. Also, the memory controller 100 may perform an operation of controlling a refresh operation for the ranks based on the decided refresh cycles in step 1600B.

According to one embodiment of the present invention, the operation of deciding the refresh cycles may include diagnosing performance in each of the ranks when the program is executed; and deciding the refresh cycles based on the diagnosis result.

According to one embodiment of the present invention, the operation of deciding the refresh cycles may include raising a refresh cycle for a rank whose performance is diagnosed to be degraded due to the execution of the program among the ranks.

According to one embodiment of the present invention, when the error rate of the at least one rank according to the execution of the program falls in a predetermined range, the operation of deciding the refresh cycles may include raising the refresh cycle for the at least one rank.

According to one embodiment of the present invention, the operation of deciding the refresh cycles may include calculating the variation amounts of the error rate and the refresh cycle for the at least one rank; and deciding the refresh cycle of the at least one rank based on the calculated variation amounts.

According to one embodiment of the present invention, the operation of deciding the refresh cycles may include deciding the refresh cycles based on a plurality of predetermined variables. The variables may include at least one among process variation, temperature/environment, the kind of a program executed, the total throughput of a program processed by all ranks per unit time, a workload distribution of each rank per unit time, a real-time error correction rate, and distinction between an aging fault and an intermittent fault.

FIGS. 17A to 17D are flowcharts describing an operation of adjusting a refresh cycle for a memory device that is performed by the memory system in accordance with the embodiment of the present invention.

Figure 17A:
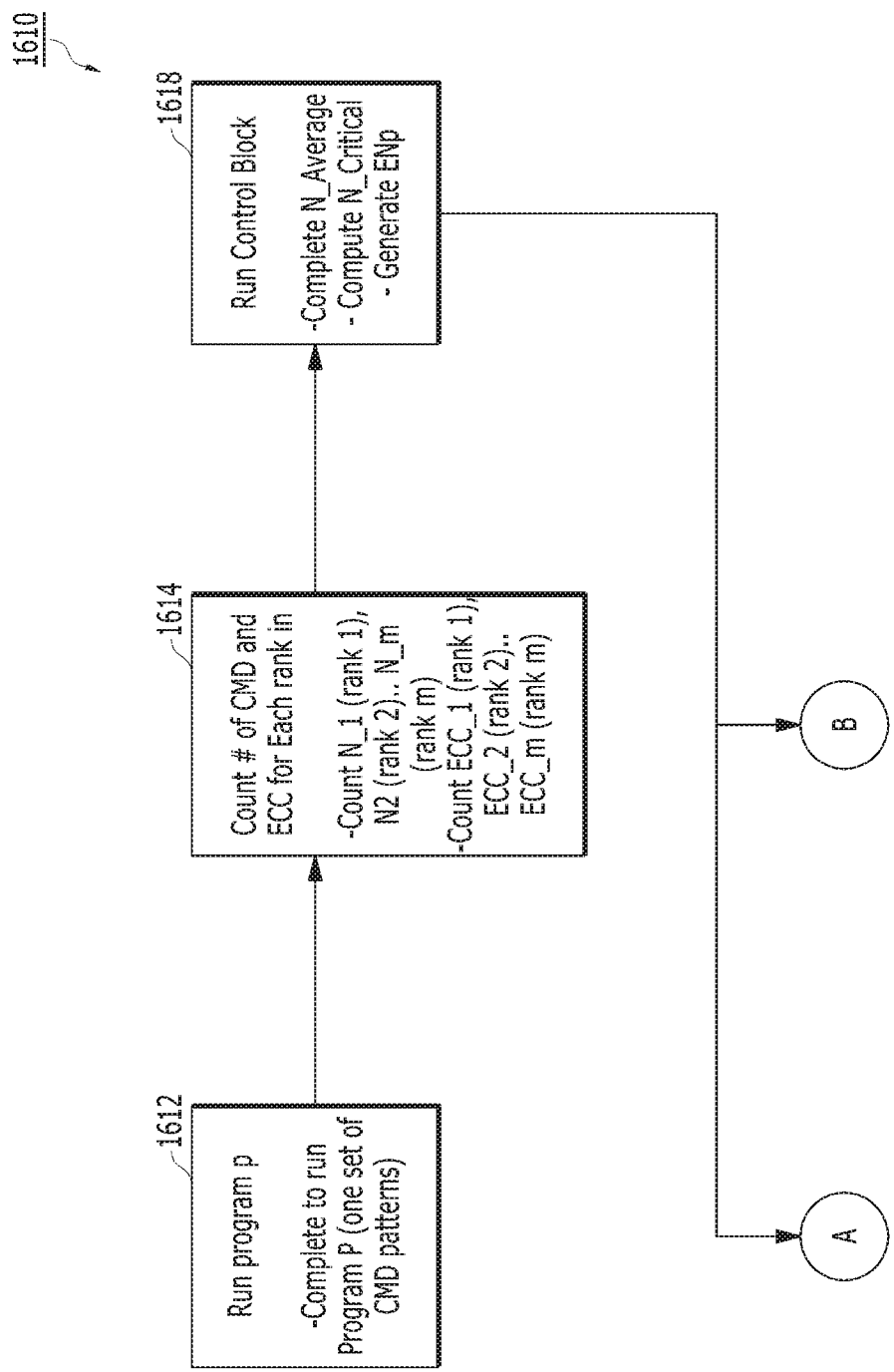
FIGS. 17A to 17D are flowcharts describing an operation of adjusting a refresh cycle for a memory device performed by the memory system in accordance with an embodiment of the present invention.

The flow 1610 shown in FIG. 17A may be performed by the second control unit 500 of the control unit 100A and the control block 300B of the computation network 300 shown in FIGS. 2, 4, 5, 7 and 8.

Referring to FIG. 17A, when the execution of a particular program set is completed in step 1612, the second control unit 500 may count and accumulate the number of CMD sets {N_1, N_2, . . . , N_m} per rank and the number of ECC correction {ECC_1, ECC_2, . . . , ECC_m} in step 1614. The control block 300B may receive the accumulated result numbers by the second control unit 500 and generate N_Average, N_Critical, and EN signals based on these values in step 1618.

Figure 17B:
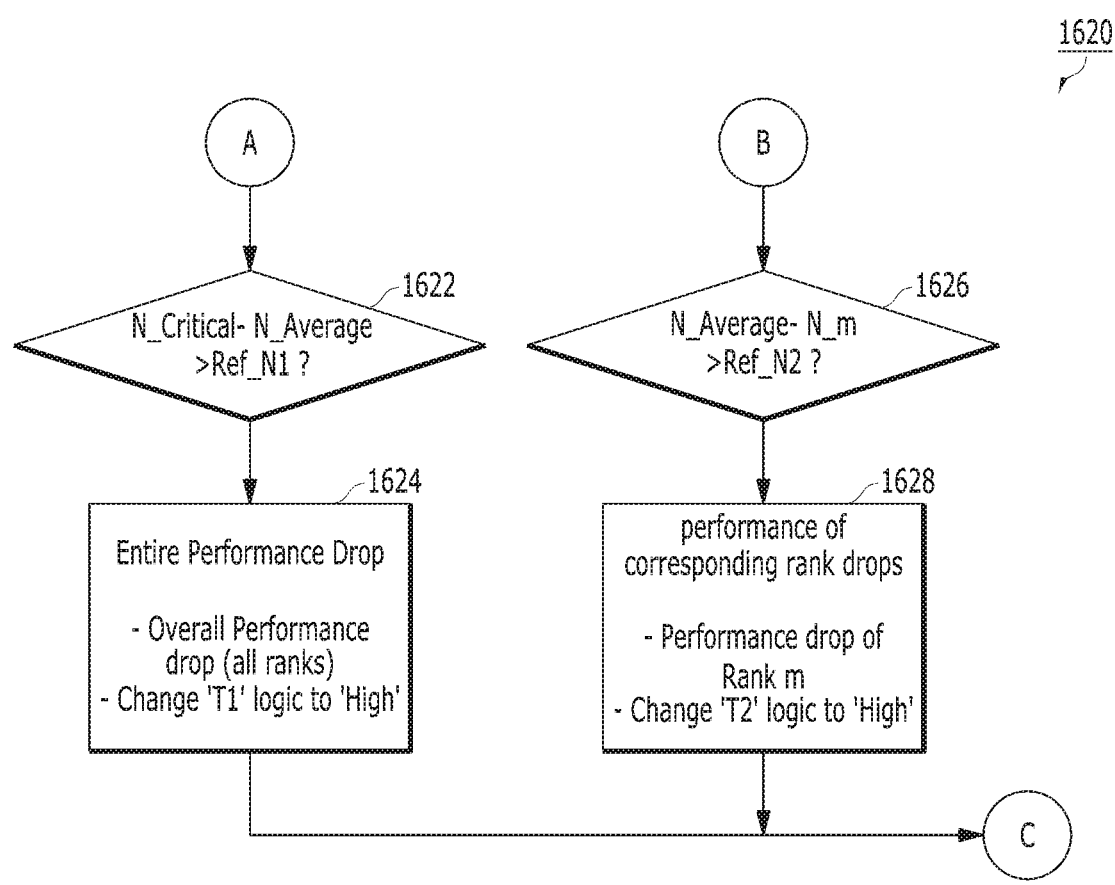

The flow 1620 shown in FIG. 17B may be performed by the performance diagnosis unit 910 illustrated in FIGS. 10 and 11.

Referring to 17B, when the performance diagnosis unit 910 decides that a condition of {N_Critical−N_Average}> Ref_N1 is satisfied in step 1622, it may be decided that the total throughput of the number of commands performed by all ranks is decreased and the signal T1 of a logic high level 'H' may be generated in response to the decision in step 1624. When it is determined that {N_Average−N_m}>Ref_N2 in step 1626, the performance diagnosis unit 910 may decide that the number of processed commands of a corresponding rank is less than the throughputs of the other ranks and generate the signal T2 of a logic high level 'H' in response to the decision in step 1628.

Figure 17C:
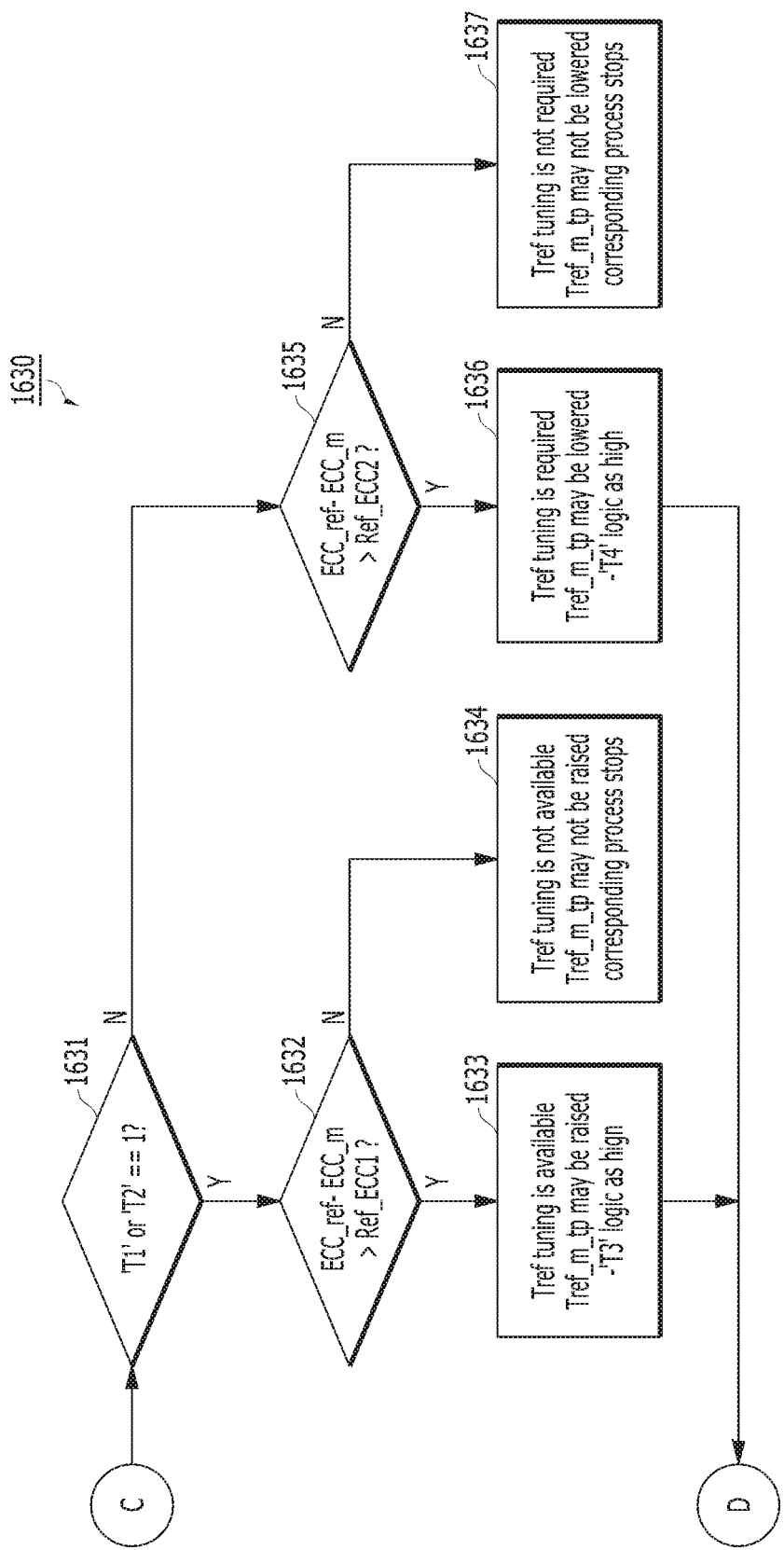

The flow 1630 shown in FIG. 17C may be performed by the ECC diagnosis unit 920 illustrated in FIGS. 10 and 12.

Referring to FIG. 17C, when the signal T1 or the signal T2 is of a logic high level 'H' level (or level of '1'), the refresh cycle needs to be adjusted upward in step 1631. However, the ECC diagnosis unit 920 may not directly raise the refresh cycle. The ECC diagnosis unit 920 may perform a process of deciding whether the refresh cycle of the ECC failure situation may be adjusted upward.

When the ECC diagnosis unit 920 decides that ECC_m (current state of ECC failure level) is smaller than ECC_ref (maximum tolerance), that is, {(ECC_ref−ECC_m)> Ref_ECC1} in step 1632, it may adjust the refresh cycle Tref_m_tp upward by generating the signal T3 of a logic high level 'H' in step 1633. On the other hand, when it is decided that {(ECC_ref−ECC_m)>Ref_ECC1}, the ECC diagnosis unit 920 may decide that the refresh cycle Tref_m_tp is not adjustable in step 1633.

When performance degradation is not detected, that is, when the signal T1 and the signal T2 are both at a logic low level 'L' (or at the level of '0'), the refresh cycle is selectively adjusted downward. The downward adjustment operation of the refresh cycle may be performed by the ECC diagnosis unit 920 according to the decision result of whether the current ECC level is higher than a reference value.

When it is decided that the current ECC level is higher than the reference value, i.e., {ECC_ref−ECC_m}<Ref_ECC2 in step 1635, the ECC diagnosis unit 920 may generate the signal T4 of a logic high level 'H' to adjust the refresh cycle Tref_m_tp downward in step 1636. On the other hand, when it is decided that {ECC_ref−ECC_m} is not less than Ref_ECC2 in the step 1635, the ECC diagnosis unit 920 may decide that the refresh cycle Tref_m_tp does not need to be adjusted downward in step 1637.

Figure 17D:
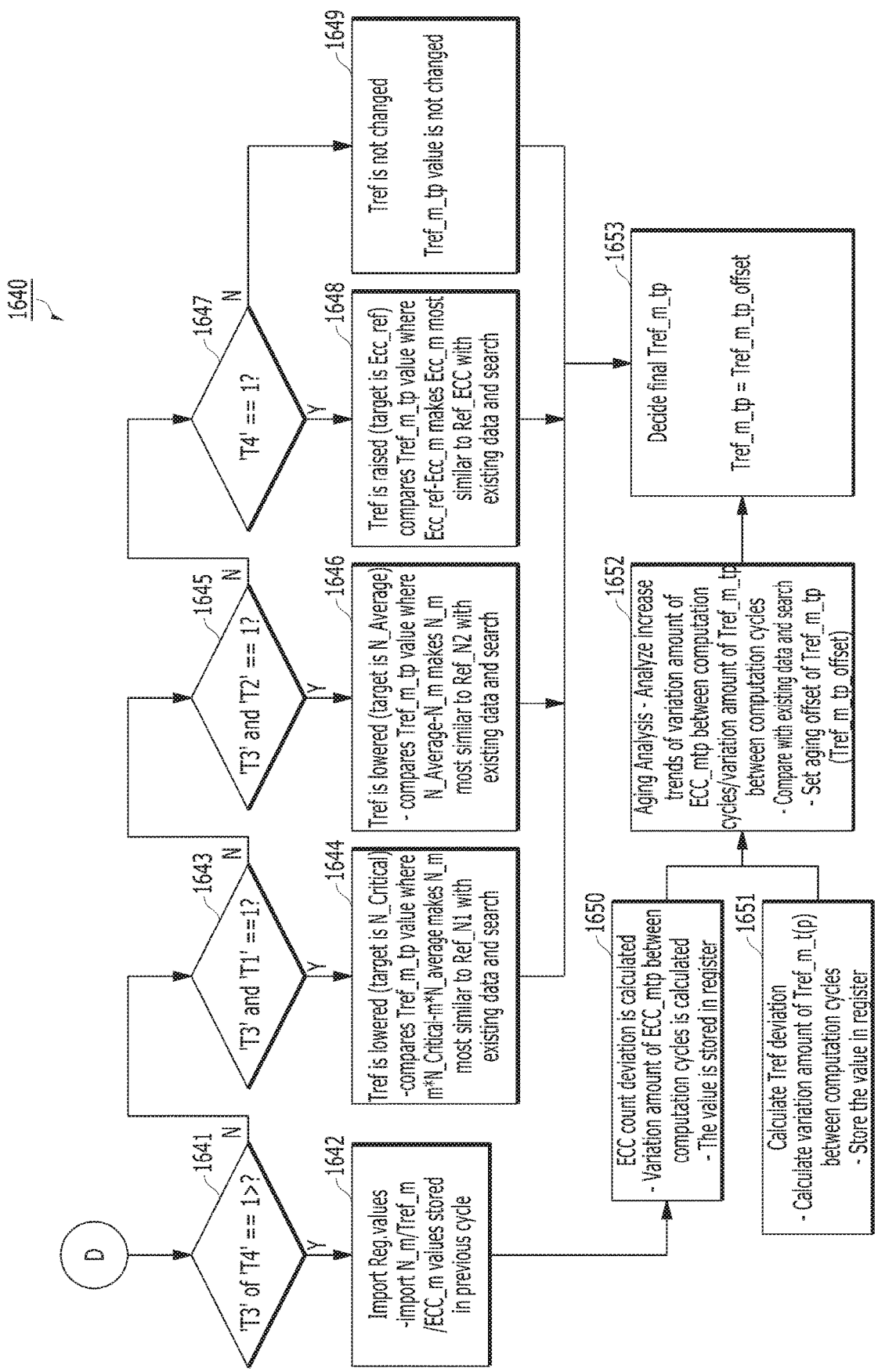

The flow 1640 shown in FIG. 17D may be performed by the adjustment control unit 930 illustrated in FIGS. 10, 13 and 15.

Referring to FIG. 17D, when the signal T3 or the signal T4 is of a logic high level 'H' (or level of '1') in step 1641, the adjustment control unit 930 may read N_m/Tref_m/ ECC_m values stored in the previous cycle from the lookup table included in the register unit 940 in step 1642.

When both the signal T3 and the signal T4 are in a logic high level 'H' (or level of '1') in step 1643, the adjustment control unit 930 may adjust the refresh cycle Tref upward in step 1644. In other words, the adjustment unit 930 may set the value Tref_m_tp value in which {m*N_Critical− m*N_average} (where m is the number of ranks) makes N_m most similar to the reference value Ref_N1. Herein, the adjustment control unit 930 may search existing data stored in the lookup table of the register block 940 and set it as a new value Tref_m_tp.

When both the signal T3 and the signal T2 are in a logic high level 'H' (or level of '1') in step 1645, the adjustment control unit 930 may decide that the performance of the corresponding rank is much lower than those of the other ranks and adjust the refresh cycle Tref upward in step 1646. The adjustment control unit 930 may set the value Tref_m_ tp in which {N_average−N_m} makes N_m most similar to Ref_N2. Herein, the adjustment control unit 930 may search the existing data stored in the lookup table of the register unit 940 and set it as a new value Tref_m_tp.

When it is decided that the signal T4 is of a logic high level 'H' (or level of '1') in step 1647, the adjustment control unit 930 may decide that the current ECC failure rate is too high and adjust the refresh cycle Tref downward in step 1648.

When it is not decided that the signal T4 is of a logic high level 'H' (or level of '1') in the step 1647, the adjustment control unit 930 may not perform the operation of adjusting the refresh cycle Tref in step 1649.

The operation of adjusting the refresh cycle Tref which is described above may be performed by the refresh Tref adjuster 934 of the adjustment control unit 930. Then, an aging adjustment operation may be performed. The aging adjustment operation may be performed by the aging adjuster 932 of the adjustment control unit 930.

The adjustment control unit 930 may calculate the variation amount of an ECC count in step 1650 from the values N_m/Tref_m/ECC_m that are stored in the previous cycle loaded from the lookup table included in the register unit 940 in step 1650. The adjustment control unit 930 may calculate the variation amount of the refresh cycle Tref in step 1651. The adjustment control unit 930 may calculate the variation amount of the value ECC_m_tp for each cycle and the variation amount of the value Tref_m_tp for each cycle. The adjustment control unit 930 may store the values in the lookup table of the register unit 940.

The adjustment control unit 930 may analyze whether the ratio of the variation amount of the value ECC_m_tp for each cycle to the variation amount of the value Tref_m_tp for each cycle increases or not based on time in step 1652. When it is decided that the ratio of the variation amount of the value ECC_m_tp for each cycle to the variation amount of the value Tref_m_tp for each cycle increases based on time, the adjustment control unit 930 may decide that the aging phenomenon is being intensified and set the aging offset Tref_m_tp-offset for the refresh rate by referring to the extent of aging in step 1652.

Finally, the adjustment control unit 930 may decide the final refresh rate by subtracting a corresponding offset value from the previously decided refresh rate Tref_m_tp. The adjustment control unit 930 may transfer the obtained final refresh rate to the first control unit 400 of the controller unit 100A. The first control unit 400 may then perform a refresh operation onto the memory device 200. Also, the adjustment control unit 930 may update the register unit 940 with information on the final refresh rate.

According to the embodiments of the present invention described above, the memory controller may decide an optimized refresh cycle corresponding to each of the combinations of a plurality of ranks included in a memory device and a plurality of programs performed in a memory device. As the optimized refresh cycle is decided according to each rank and each program, the reliability of a system may be enhanced and the performance of the system may be optimized or customized.

According to the embodiments of the present invention, a memory controller may accumulate, store, analyze, and learn diverse variables for deciding a refresh cycle by using a simultaneous parallel processing technique using a neural network algorithm. This parallel processing technique may be advantageous in terms of computation speed, accuracy, and power consumption of the memory controller. The variables may include a total of seven variables, which include the process variation per memory rank, temperature/environment, the kind of a command set (or program) executed, the total throughput of command sets processed by all ranks per unit time, a workload distribution of each rank per unit time, an additional fault rate (i.e., ECC correction rate) occurring in real-time in an actual memory, and distinction between aging faults and intermittent faults.

Also, according to diverse embodiments of the present invention, the memory controller may store and analyze and learn the ratio of the ECC failure rate tendency to the refresh cycle tendency over time to decide whether the faults of the memory device are intermittent faults or aging faults and adjust the refresh cycle according to the decision.

While the present invention has been described with respect to the specific embodiments, it will be apparent to those skilled in the art that various changes and modifications may be made without departing from the spirit and scope of the invention as defined in the following claims.

What is claimed is:

1. A memory system, comprising:
 a memory device that includes a plurality of memory ranks; and
 a memory controller configured to:
  determine a plurality of refresh cycles for respective combinations of the plurality of memory ranks and at least one program executed onto the memory device based on a performance diagnosis result for each of the memory ranks when the program is executed, and
  control a refresh operation performed on the memory ranks using the determined refresh cycles,
  wherein the performance diagnostic result is determined by comparing an average value of a number of command sets performed by all memory ranks when a corresponding program is executed, with a reference throughput value.

2. The memory system of claim 1, wherein the memory controller increases a refresh cycle of at least one rank whose performance is diagnosed as degraded when the program is executed among the memory ranks.

3. The memory system of claim 2, wherein, when an error rate of the at least one rank resulting from the execution of the program is within a predetermined range, the memory controller increases the refresh cycle of the at least one rank.

4. The memory system of claim 3, wherein the memory controller calculates a variation amount of an error rate and a variation amount of a refresh cycle for the at least one rank to produce calculated variation amounts, and determines the refresh cycle for the at least one rank based on the calculated variation amounts.

5. The memory system of claim 1, wherein the memory controller determines the refresh cycles based on a plurality of predetermined variables, and
 the predetermined variables include at least one among process variation, temperature/environment, a kind of a program executed, a total throughput of program processed by all memory ranks per unit time, a workload distribution of each rank per unit time, a real-time error rate, and distinction between an aging fault and an intermittent fault.

6. The memory system of claim 5, wherein the memory controller includes:
 a computation network configured to perform a computation operation in parallel onto the variables and determine the refresh cycles by being provided with a plurality of computation units that respectively correspond to the combinations of the at least one program and the memory ranks; and
 a control unit configured to receive the program and error correction information during the execution of the program from the memory device, generating information on the variables based on the received information, and transferring the generated information to the computation network.

7. The memory system of claim 6, wherein the computation network includes:
 a control block configured to receive first information on the number of commands and the number of error corrections for each rank related to the execution of the program from the control unit, and determine second information on an average number of commands executed by the memory ranks and an average value of least numbers of commands; and
 a plurality of computation units that respectively correspond to the combinations, receive the first information and the second information from the control block, and determine the refresh cycles.

8. The memory system of claim 7, wherein the control block receives information on the refresh cycles from the computation units and controls a refresh operation performed on the memory ranks based on the information on the refresh cycles.

9. The memory system of claim 7, wherein each of the computation units includes:
 a performance diagnosis unit configured to diagnose performance of each of the memory ranks based on the first information and the second information to produce a performance diagnosis result; and
 an adjustment control unit configured to adjust the refresh cycles based on the performance diagnosis result, the first information, and the second information.

10. The memory system of claim 9, wherein each of the computation units further includes:
 an error correction code (ECC) diagnosis unit configured to diagnose an error rate of each of the memory ranks based on the first information to produce an ECC diagnosis result, and
 the adjustment control unit adjusts the refresh cycles based on the performance diagnosis result and the ECC diagnosis result.

11. The memory system of claim 10, wherein the adjustment control unit calculates a variation amount of an error rate and a variation amount of a refresh cycle for the at least one rank to produce an error rate variation amount calculation result and a refresh cycle variation amount calculation result, and determines the refresh cycle for the at least one rank based on the error rate variation amount calculation result and the refresh cycle variation amount calculation result.

12. A method for controlling a memory system including a memory device provided with a plurality of memory ranks, comprising:

performing an Error Correction Code (ECC) operation onto plural data stored in, or outputted from, at least one rank of the memory device in parallel;

determining a plurality of refresh cycles that respectively correspond to combinations of the plurality of memory ranks and at least one program executed onto the memory device based on a performance diagnosis result for each of the memory ranks when the program is executed; and controlling a refresh operation performed onto the at least one rank using the determine refresh cycles to cure an ECC uncorrectable error while the ECC operation is performed, wherein the performance diagnostic result is determined by comparing an average value of a number of command sets performed by all memory ranks when a corresponding program is executed, with a reference throughput value.

13. The method of claim 12, wherein the determining the refresh cycles includes:

diagnosing performance of each of the memory ranks when the program is executed to produce performance diagnosis results; and determining the refresh cycles based on the performance diagnosis results.

14. The method of claim 13, wherein the determining the refresh cycles includes:

upwardly increasing a refresh cycle of at least one rank whose performance is diagnosed as degraded when the program is executed among the memory ranks.

15. The method of claim 14, wherein the determining the refresh cycles includes:

increasing the refresh cycle of the at least one rank when an error rate of the at least one rank resulting from the execution of the program is within a predetermined range.

16. The method of claim 15, wherein the determining the refresh cycles includes:

calculating a variation amount of an error rate and a variation amount of a refresh cycle for the at least one rank to produce calculated variation amounts; and determining the refresh cycle for the at least one rank based on the calculated variation amounts.

17. The method of claim 12, wherein the determining the refresh cycles includes:

determining the refresh cycles based on a plurality of predetermined variables, and the predetermined variables include at least one among process variation, temperature/environment, a kind of a program executed, a total throughput of a program processed by all memory ranks per unit time, a workload distribution of each rank per unit time, a real-time error rate, and distinction between an aging fault and an intermittent fault.

18. The method of claim 17, wherein the determining the refresh cycles includes:

receiving the program and error correction information during the execution of the program from the memory device; and determining the refresh cycles by being provided with a plurality of computation units that respectively correspond to the combinations of the at least one program and the memory ranks and performing a computation operation onto the variables in parallel based on the received information.

19. The method of claim 18, wherein the determining the refresh cycles includes:

determining the refresh cycles based on first information on the number of commands and the number of error corrections for each rank related to the execution of the program and second information on an average number of commands executed by the memory ranks and an average value of least numbers of commands.

20. The method of claim 19, wherein the determining the refresh cycles includes:

diagnosing performance of each of the memory ranks based on the first information and the second information to produce a performance diagnosis result; and adjusting the refresh cycles based on the performance diagnosis result, the first information and the second information.

21. A memory system, comprising:

a memory device including a plurality of memory ranks; and a memory controller configured to diagnose a performance each of the memory ranks when the program is executed, to cure an ECC uncorrectable error while the ECC operation is performed, wherein a memory controller determines a plurality of refresh cycles, each corresponding to at least one of various combinations regarding the plurality of memory ranks and at least one program executed onto the memory device, based on a diagnosis result, to control a refresh operation performed on the memory ranks based on the determined refresh cycles, and wherein the diagnosis result is determined by comparing an average value of a number of command sets performed by all memory ranks when a corresponding program is executed, with a reference throughput value.

* * * * *